United States Patent
Sakamoto et al.

(10) Patent No.: US 6,624,511 B2
(45) Date of Patent: Sep. 23, 2003

(54) HYBRID INTEGRATED CIRCUIT DEVICE

(75) Inventors: Noriaki Sakamoto, Gunma (JP); Yoshiyuki Kobayashi, Gunma (JP); Eiju Maehara, Gunma (JP); Noriyasu Sakai, Gunma (JP); Hitoshi Takagishi, Gunma (JP); Kouji Takahashi, Gunma (JP); Kazuhisa Kusano, Gunma (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/821,447

(22) Filed: Mar. 29, 2001

(65) Prior Publication Data
US 2002/0030268 A1 Mar. 14, 2002

(30) Foreign Application Priority Data
Jun. 8, 2000 (JP) ........................................ 2000-172531

(51) Int. Cl.[7] .................... H01L 23/48; H01L 23/495; B23K 31/00
(52) U.S. Cl. .................... 257/734; 257/669; 228/180.5
(58) Field of Search ................................ 257/700, 669, 257/667, 734; 228/180.5

(56) References Cited

U.S. PATENT DOCUMENTS

| 5,428,885 | A | * | 7/1995 | Takaya et al. ........... 156/89.28 |
| 5,504,372 | A | * | 4/1996 | Braden et al. ............... 257/706 |
| 6,358,780 | B1 | * | 3/2002 | Smith et al. ................ 438/112 |
| 2002/0033530 | A1 | * | 3/2002 | Sakamoto et al. .......... 257/729 |

* cited by examiner

Primary Examiner—Amir Zarabian
Assistant Examiner—Kusha Rose
(74) Attorney, Agent, or Firm—Fish & Richardson P.C.

(57) ABSTRACT

The semiconductor elements for the small signal type circuits and the Au wire for connection are integrated as one package to produce the semiconductor devices 30A, 31A, 32, 33A, 34A and 38. In this way, the wire bonding of Au can be omitted, and the wire bonding of the small diameter Al wire and the large diameter Al wire is only required to complete the connection of the fine metal wire.

These semiconductor devices have a plurality of circuit elements as one package, so that the mounting operation on the mounting board can be significantly reduced.

19 Claims, 16 Drawing Sheets

60

PR

60

FIG.21 Example: Differential Current Mirror Circuit
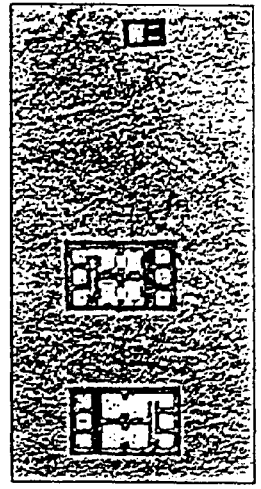
Single SMD
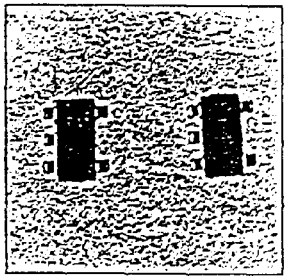
Complexed SMD
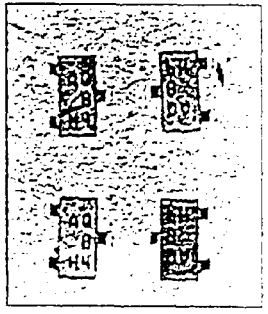
Semiconductor Device of this Invention
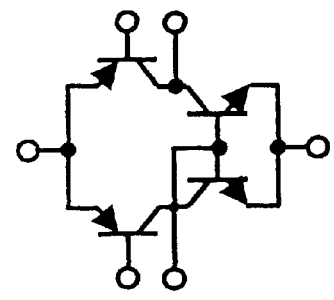
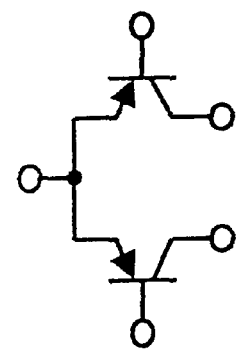
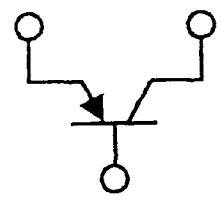
Equivalent Circuit

HYBRID INTEGRATED CIRCUIT DEVICE

BACKGROUND OF THE INVENTION

1. Field of the Invention

The present invention relates to a hybrid integrated circuit device, and more particularly to a hybrid integrated circuit device in which the bonding with the fine metal wire can be reduced and the number of assembling steps diminished.

2. Description of the Related Art

Conventionally, a hybrid integrated circuit device to be placed in the electronic equipment is formed with a conductive pattern on a printed circuit board, a ceramic substrate, or a metallic board, in which the active elements such as an LSI or a discrete TR and the passive elements such as a chip condenser, a chip resistor or a coil are mounted on the conductive pattern. And the conductive pattern and said elements are electrically connected to realize a circuit with predetermined functions.

One example of the circuit is shown in FIG. 19. This circuit is an audio circuit, with those elements mounted as shown in FIG. 20.

In FIG. 20, a mounting board 1 with at least its surface insulated is shown by the outermost rectangular line. And on this mounting board 1, a conductive pattern 2 made of Cu is formed. This conductive pattern 2 is made up of an outside lead-out electrode 2A, an interconnect 2B, a die pad 2C, a bonding pad 2D, and an electrode 4 for securing a passive element 3.

The die pad 2C has a TR, a diode, a composite element or an LSI fixed by solder in a bare chip form. And the electrode on the fixed chip and the bonding pad 2D are electrically connected via the fine metal wires 5A, 5B, 5C. This fine metal wire is typically classified into those for a small signal and a large signal, a fine metal wire of 20 to 80 $\mu m \phi$ being used for small signal purpose. Here, the Au wire 5A or Al wire of about 40 $\mu m \phi$ is employed. Also, for large signal purpose, the Au wire or Al wire of about 100 to 300 $\mu m \phi$ is employed. In particular, the wire diameter for large signal is great, and in view of the costs, the Al wire 5B of 150 $\mu m \phi$ or the Al wire 5C of 300 $\mu m \phi$ is selected.

A power TR 6 for passing a large current is fixed to a heat sink 7 on the die pad 2C to prevent temperature rise of the chip.

And the interconnect 2B for connecting the outside lead-out electrode 2A, the die pad 2C, the bonding pad 2D, and the electrode 4 extends over the board to make a circuit. Also, in the case where the interconnects cross each other owing to the chip position or the way of interconnecting, the jumping wires 8A, 8B are employed.

As will be apparent from FIG. 20, a chip conductor, a chip resistor, a small signal TR chip, a large signal TR chip, a diode, and an LSI are employed, and fixed by the brazing material. And the semiconductor element such as a TR chip is electrically connected using a fine metal wire. This fine metal wire is classified into a plurality of sorts depending on the current capacity. There are a great number of sorts for the fine metal wire. As can be seen from this, the fixing of chip or connection of fine metal wire brought about the problem that the assembling process is significantly complex, resulting in the increased costs.

Lately, the chips having a chip size of as small as 0.45×0.5 mm, 0.25 mm in thickness with the low unit price have been put on the market. However, if this chip is fixed by solder, the solder is sucked up on the side face of chip, causing a short-circuit, and making it difficult to employ this chip for the hybrid integrated circuit device.

If a package with the semiconductor elements fixed on a lead frame is mounted on a hybrid integrated circuit board, the size of this package is very great, resulting in the problem that the size of the hybrid integrated circuit board is increased.

As described above, even if the hybrid integrated circuit board was employed to cut down the costs, there was the problem that the very small chips could not be mounted, and the assembling process was lengthened to increase the costs.

SUMMARY OF THE INVENTION

The present invention has been achieved in the light of the above-mentioned problems, and a first aspect of the invention is a hybrid integrated circuit device at least comprising a mounting board having at least a surface insulated and with a plurality of conductive patterns, a semiconductor element electrically connected to the conductive pattern, and a fine metal wire for bonding a bonding electrode of the semiconductor element with the conductive pattern, wherein a semiconductor device having the fine metal wire and the semiconductor element bonded by the fine metal wire as one package is mounted on the mounting board.

If a semiconductor device packaged beforehand is prepared, and mounted on the mounting board, the assembling process of the hybrid integrated circuit device can reduce the number of bonding the fine metal wire, and can be shortened.

A second aspect of the invention is the hybrid integrated circuit device, wherein a plurality of kinds of fine metal wires made of different materials are used, at least one kind of fine metal wire being totally packaged in the semiconductor device For example, in the case where the hybrid integrated circuit device is made up of the Au wire and the Al wire, If a semiconductor element using the Au wire is prepared for a semiconductor device, the assembling process of the hybrid integrated circuit device can do away with the bonding of the Au wire, and is met with the bonding of the Al wire alone. Accordingly, the bonding for the Au wire can be dispensed with from the assembling process, resulting in the simplified assembling process.

A third aspect of the invention is the hybrid integrated circuit device, wherein a plurality of kinds of the fine metal wires having different wire diameters are used, at least one kind of fine metal wire being totally packaged in the semiconductor device.

For example, in the case where the fine metal wires of 300 $\mu m$ and 105 $\mu m$ are laid, the assembling process can dispense with the bonding for the fine metal wire of 150 $\mu m$, if a semiconductor device bonded by the fine metal wire of 150 $\mu m$ is prepared.

A fourth aspect of the invention is the hybrid integrated circuit device, wherein all of the fine metal wires are packaged in the semiconductor device.

In assembling the hybrid integrated circuit device, the bonding of the fine metal wire can be totally dispensed with.

A fifth aspect of the invention is a hybrid integrated circuit device at least comprising a mounting board having at least a surface insulated and with a plurality of conductive patterns, a small signal type semiconductor element electrically connected to the conductive pattern, a large signal type semiconductor element electrically connected to the conductive pattern, an Au wire for bonding at least a bonding electrode of the small signal type semiconductor element with the conductive pattern, an Al wire for bonding the conductive patterns, wherein a semiconductor device having the Au wire and the semiconductor element bonded by the Au wire as one package is mounted on the mounting board.

A sixth aspect of the invention is the hybrid integrated circuit device, wherein the fine metal wire for bonding the conductive patterns is the Al wire.

A seventh aspect of the invention is a hybrid integrated circuit device at least comprising a mounting board having at least a surface insulated and with a plurality of conductive patterns, a small signal type semiconductor element electrically connected to the conductive pattern, a large signal type semiconductor element electrically connected to the conductive pattern, an Au wire for bonding the conductive patterns, and an Al wire for bonding at least the large signal type semiconductor element with the conductive pattern, wherein a semiconductor device having the Al wire and the large signal type semiconductor element bonded by the Al wire as one package is mounted on the mounting board.

An eighth aspect of the invention is the hybrid integrated circuit device, wherein the fine metal wire for bonding the conductive patterns is the Au wire.

A ninth aspect of the invention is a hybrid integrated circuit device at least comprising a mounting board having at least a surface insulated and with a plurality of conductive patterns, a small signal type semiconductor element electrically connected to the conductive pattern, a large signal type semiconductor element electrically connected to the conductive pattern, a small diameter fine metal wire for bonding at least a bonding electrode of the small signal type semiconductor element with the conductive pattern, and a large diameter fine metal wire for bonding the conductive patterns, wherein a semiconductor device having the small diameter fine metal wire and the semiconductor element bonded by the small diameter fine metal wire as one package is mounted on the mounting board.

A tenth aspect of the invention is the hybrid integrated circuit device, wherein the fine metal wire for bonding the conductive patterns is the large diameter fine metal wire.

An eleventh aspect of the invention is a hybrid integrated circuit device at least comprising a mounting board having at least a surface insulated and with a plurality of conductive patterns, a small signal type semiconductor element electrically connected to the conductive pattern, a large signal type semiconductor element electrically connected to the conductive pattern, a small diameter fine metal wire for bonding the conductive patterns, and a large diameter fine metal wire for bonding at least a bonding electrode of the large signal type semiconductor element with the conductive pattern, wherein a semiconductor device having the large diameter fine wire and the semiconductor element bonded by the large diameter fine wire as one package is mounted on the mounting board.

A twelfth aspect of the invention is the hybrid integrated circuit device, wherein the fine metal wire for bonding the conductive patterns is the small diameter fine wire.

A thirteenth aspect of the invention is a hybrid integrated circuit device at least comprising a mounting board having at least a surface insulated and with a plurality of conductive patterns, a small signal type semiconductor element electrically connected to the conductive pattern, a large signal type semiconductor element electrically connected to the conductive pattern, an Au wire for bonding at least a bonding electrode of the small signal type semiconductor element with the conductive pattern, and an Al wire for bonding the conductive patterns, wherein a semiconductor device is mounted on the mounting board, the semiconductor device having a plurality of conductive paths electrically separated by a trench, a small signal type semiconductor element fixed on the conductive path, an Au wire connecting the small signal type semiconductor element with the conductive path, and an insulating resin for coating the semiconductor element and the Au wire and being filled in the trench between the conductive paths to serve as the integral support, with a back face of the conductive paths exposed, and wherein connecting means other than the Au wire is used in an area except where the semiconductor device is mounted.

A fourteenth aspect of the invention is a hybrid integrated circuit device at least comprising a mounting board having at least a surface insulated and with a plurality of conductive patterns, a small signal type semiconductor element electrically connected to the conductive pattern, a large signal type semiconductor element electrically connected to the conductive pattern, an Au wire for bonding the conductive patterns, and an Al wire for bonding at least the large signal type semiconductor element with the conductive pattern, wherein a semiconductor device is mounted on the mounting board, the semiconductor device having a plurality of conductive paths electrically separated by a trench, a large signal type semiconductor element fixed on the conductive path, an Al wire connecting the large signal type semiconductor element with the conductive path, and an insulating resin for coating the large signal type semiconductor element and the Al wire and being filled in the trench between the conductive paths to serve as the integral support, with a back face of the conductive paths exposed, and wherein connecting means other than the Al wire is used in an area except where the semiconductor device is mounted.

A fifteenth aspect of the invention is a hybrid integrated circuit device at least comprising a mounting board having at least a surface insulated and with a plurality of conductive patterns, a small signal type semiconductor element electrically connected to the conductive pattern, a large signal type semiconductor element electrically connected to the conductive pattern, a small diameter fine metal wire for bonding at least a bonding electrode of the small signal type semiconductor element with the conductive pattern, and a large diameter fine metal wire for bonding the conductive patterns, wherein a semiconductor device is mounted on the mounting board, the semiconductor device having a plurality of conductive paths electrically separated by a trench, a small signal type semiconductor element fixed on the conductive path, a small diameter fine metal wire connecting the small signal type semiconductor element with the conductive path, and an insulating resin for coating the semiconductor element and the small diameter fine wire and being filled in the trench between the conductive paths to serve as the integral support, with a back face of the conductive paths exposed, and wherein connecting means other than the small diameter fine metal wire is used in an area except where the semiconductor device is mounted.

A sixteenth aspect of the invention is a hybrid integrated circuit device at least comprising a mounting board having at least a surface insulated and with a plurality of conductive patterns, a small signal type semiconductor element electrically connected to the conductive pattern, a large signal type semiconductor element electrically connected to the conductive pattern, a small diameter fine metal wire for bonding the conductive patterns, and a large diameter fine metal wire for bonding the large signal type semiconductor element with the conductive pattern, wherein a semiconductor device is mounted on the mounting board, the semiconductor device having a plurality of conductive paths electrically separated by a trench, a large signal type semiconductor element fixed on the conductive path, a large diameter fine metal wire connecting the large signal type semiconductor element with the conductive path, and an insulating resin for coating the semiconductor element and the large diameter fine metal wire and being filled in the trench between the conductive paths to serve as the integral support, with a back face of the conductive paths exposed, and wherein connecting means other than the large diameter fine metal wire is used in an area except where the semiconductor device is mounted.

A seventeenth aspect of the invention is a hybrid integrated circuit device at least comprising a mounting board having at least a surface insulated and with a plurality of conductive patterns, a small signal type semiconductor element electrically connected to the conductive pattern, a large signal type semiconductor element electrically connected to the conductive pattern, a small diameter fine metal wire for bonding the small signal type semiconductor element with the conductive pattern, and a large diameter fine metal wire for bonding the large signal type semiconductor element with the conductive pattern, wherein a semiconductor device is mounted on the mounting board, the semiconductor device having a plurality of conductive paths electrically separated by a trench, a semiconductor element fixed on the conductive path, a fine metal wire connecting the semiconductor element with the conductive path, and an insulating resin for coating the semiconductor element and the fine metal wire and being filled in the trench between the conductive paths to serve as the integral support, with a back face of the conductive paths exposed, and wherein the small diameter fine metal wire and the large diameter fine metal wire are used within the semiconductor device, and the fine metal wire is not used in an area except where the semiconductor device is mounted.

An eighteenth aspect of the invention is the hybrid integrated circuit device, wherein the side face of the conductive paths has a curved structure.

A nineteenth aspect of the invention is the hybrid integrated circuit device, wherein a conductive film is provided on the conductive paths.

A twentieth aspect of the invention is the hybrid integrated circuit device, wherein an active element and/or a passive element, besides the semiconductor element, are contained and electrically connected to the conductive path, and a circuit is formed including the active element and/or the passive element.

A twenty-first aspect of the invention is the hybrid integrated circuit device, wherein the conductive paths are composed of Cu, Al, Fe—Ni alloy, Cu—Al laminate, or Al—Cu—Al laminate.

A twenty-second aspect of the invention is the hybrid integrated circuit device, wherein the conductive film is composed of Ni, Au, Ag or Pd, and is formed with a visor.

BRIEF DESCRIPTION OF THE DRAWINGS

FIG. 21 is a view for comparing the conventional semiconductor device and the semiconductor device of the invention.

DESCRIPTION OF THE PREFERRED EMBODIMENTS

Figure 1:
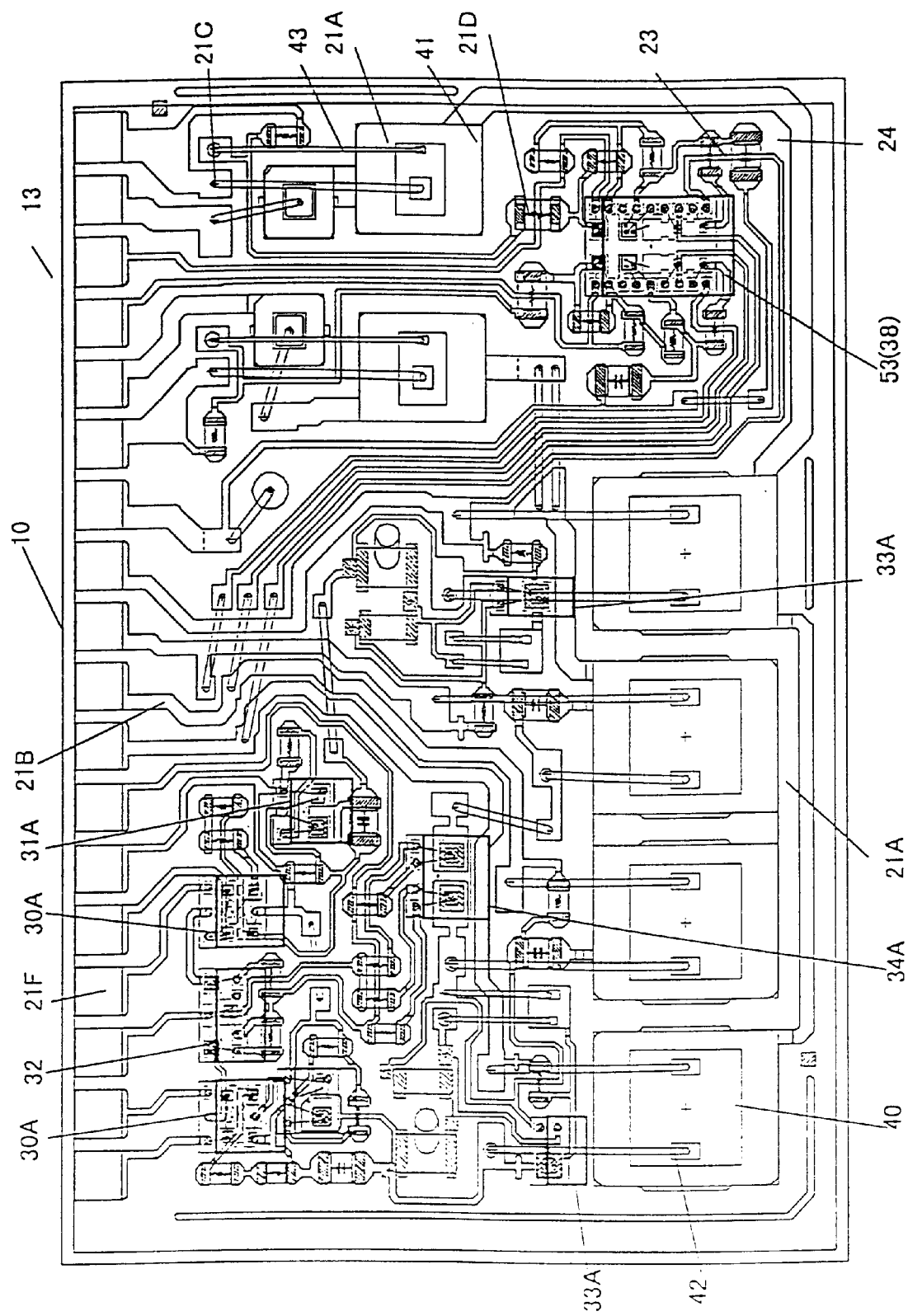
FIG. 1 is a view for explaining a hybrid integrated circuit device of the present invention.

The present invention is concerned with a hybrid integrated circuit device which is able to simplify the assembling process, and more particularly to a hybrid integrated circuit device which is able to reduce the bonding of the fine metal wire and the die bonding of the semiconductor element.

Generally, the hybrid integrated circuit device constitutes an electronic circuit having a variety of circuit elements, and is mounted with the active elements such as a TR chip, an IC chip or an LSI chip, and the passive elements such as a chip condenser or a chip resistor, as required. And these circuit elements are electrically connected with the conductive pattern formed on a mounting board. To make a circuit, the interconnect is provided on the conductive pattern, and the circuit elements are electrically connected via the brazing material, a conductive ball, a solder ball, a conductive paste, or the fine metal wire.

In particular, for the fine metal wire, the material and/or the wire diameter of the fine metal wire may be determined depending on the current capacity for a circuit element connected by the fine metal wire, or a circuit block in which the fine metal wire is employed.

A first example involves the electrical connection by means of three kinds of Al wires having the diameters of 40 $\mu$m, 150 $\mu$m and 300 $\mu$m. The reason is that the Al wire is more available.

A second example involves the electrical connection by means of an Au wire having a diameter of 40 $\mu$m and the Al wires having the diameters of 150 μm and 300 μm. The reason is that the Au wire has a shorter bonding time than the Al wire. This is because the Al wire typically employs a wedge bonding, which necessitates the application of ultrasonic wave for a certain time. For the large diameter fine metal wire, the Al wire is adopted from the respect of the costs, because the Au wire is more expensive due to thick wire diameter.

The semiconductor element of TR, IC, or LSI has a small bonding pad on the surface of chip, and the Au wire is generally employed. However, a power transistor, a power MOS, an IGBT, an SIT and a thyristor to pass a large current has a large chip size by itself, with a large current capacity, so that a large bonding pad must be formed. Therefore, the Al wire is employed in view of the costs.

As described above, the material and the wire diameter of fine metal wire are selected depending on the current capacity, the costs, the necessary area for bonding, the strength or the kind of semiconductor element to be bonded.

A point of the invention is to reduce the kinds of fine metal wire for connection on the mounting board by fixing a packaged semiconductor device on the mounting board.

For example, in the first example, a semiconductor element connected by the Al wire of 40 μm as one package is prepared separately. And if this semiconductor device is mounted using the brazing material, and the connection of fine metal wire on the mounting board is made only by the Al wires of 150 μm and 300 μm, and the Al wire of 40 μm can be fully omitted.

Some assembling methods may require different bonding apparatuses depending on three wire diameters. In this case, assembling of the hybrid integrated circuit device has a merit of needing neither a step of placing a mounting board on the bonding apparatus for 40 μm nor a step of bonding. In particular, the operation of placing the mounting board on the bonding apparatus takes some steps, making the assembling process longer.

A second example has a point in that a semiconductor device having the Au wire of 40 μm and a semiconductor element connected by the Au wire of 40 μm as one package is prepared separately. And if this semiconductor device is mounted using the brazing material and so on, the connection of the Au wire on the mounting board can be omitted, and the bonding process for the Al wires of 150 μm and 300 μm remains.

The bonding method of the Au wire is different from that of the Al wire, and employs a different bonding apparatus. Hence, if all the parts requiring the connection of the Au wire are packaged, the bonding of the Au wire can be fully dispensed with in the assembling process of the hybrid integrated circuit device. Hence, the hybrid integrated circuit device only needs the bonding of the Al wire, bringing about a merit of reducing the number of assembling steps.

As a special example, if all the fine metal wires are packaged with the semiconductor device, it is only required to provide a step of mounting the semiconductor device in the assembling process of the hybrid integrated circuit device, because the bonding of the fine metal wire can be fully omitted.

In the present invention, a variety of combinations can be possibly conceived, and have different effects, and will be briefly described below.

A first combination is the case where N sorts of fine metal wires having different wire diameters are employed on the mounting board.

By packaging at least one sort of fine metal wire and a semiconductor element connected by this fine metal wire, the connection of fine metal wire on the mounting board can be effected by using the (N−1) sorts of fine metal wires. As shown in FIG. 1, one package comprises at least one semiconductor element. A passive element or IC chip may be mounted to make a hybrid type together.

A second combination is the case where N sorts of fine metal wires having different materials are employed on the mounting board.

By packaging at least one sort of fine metal wire and a semiconductor element connected by this fine metal wire, the connection of fine metal wire on the mounting board can be done by using the (N−1) sorts of fine metal wires having different materials. As shown in FIG. 1, a package employing the Au wire is prepared, and the bonding of the Al wire is only made on the mounting board. This may be also effected by preparing a package using the Al wire, and making the bonding of the Au wire alone on the mounting board.

A third combination is the case where the fine metal wires are made of the N sorts of materials, and have different wire diameters for each material.

A simple combination is shown for explanation.

Material Al: wire diameters 300 μm, 200 μm, 150 μm

Material Au: wire diameter 40 μm

In this case, there are four combinations of material and wire diameter. Accordingly, among the four sorts of fine metal wires, at least one sort of fine metal wire is employed to form a package as previously described. Thus, less than four sorts of fine metal wires may be employed on the mounting board.

Figure 20:
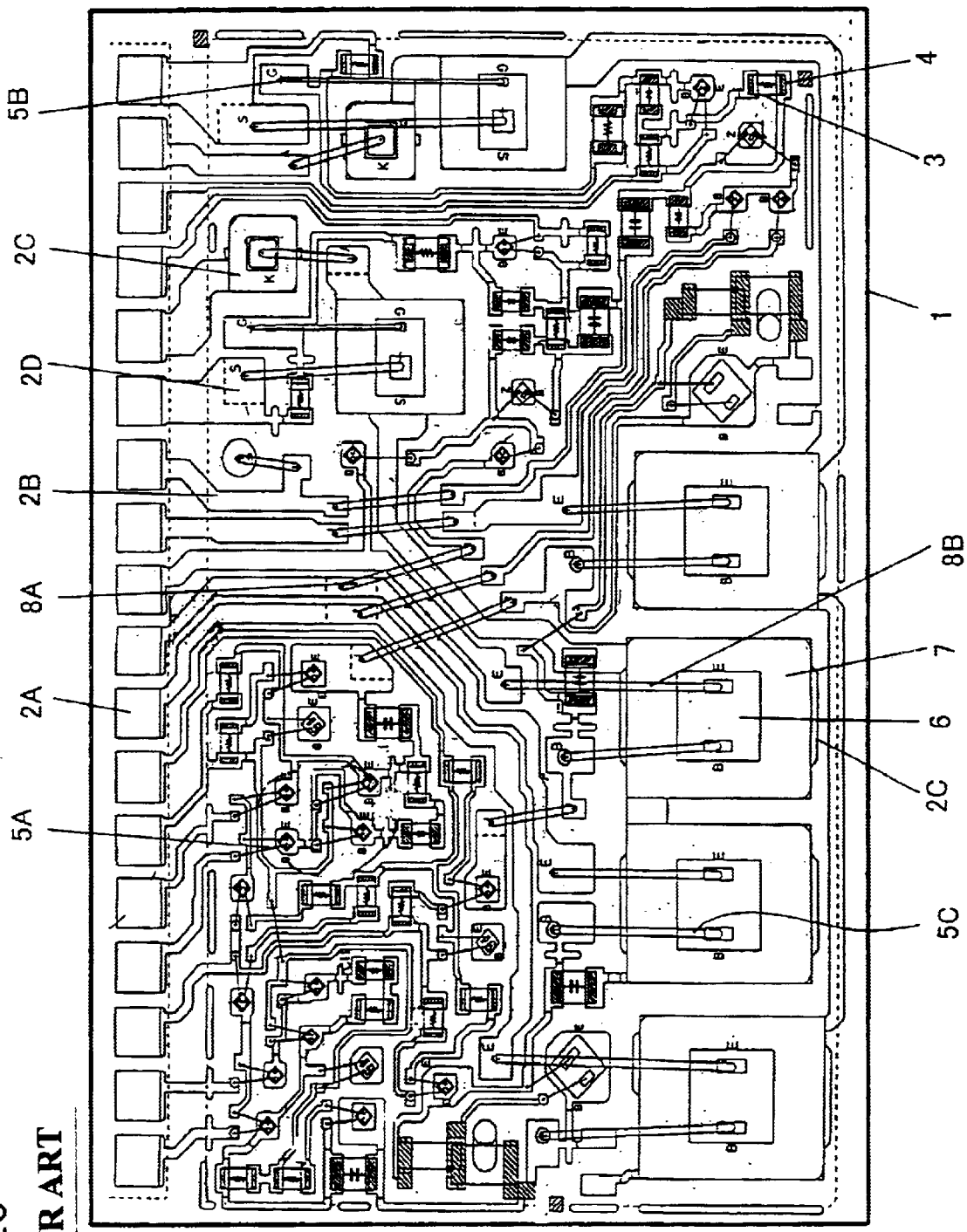
FIG. 20 is a view for explaining a conventional hybrid integrated circuit device.

The loss of carrying a die bonder for the element onto the mounting board can be greatly reduced. On the conventional mounting board as shown in FIG. 20, the elements may be placed at various positions, and must be brought into predetermined positions. However, if the semiconductor device of the invention is employed, a plurality of kinds of semiconductor elements as one package can be brought into the predetermined position at a time.

Referring now to FIG. 1, a hybrid integrated circuit device employing the Au wire of 40 μm, the Al wire of 150 μm and the Al wire of 300 μm will be described below.

This hybrid integrated circuit device 13 at least comprises a conductive pattern 21 laid on a mounting board 10, the bare chips 40, 41, the passive elements 23, 24, the semiconductor devices 30A, 31A, 32, 33A, 34A, 38, which are fixed on the conductive pattern 21, and the fine metal wires 42, 43 for connection to make a circuit.

Figure 2:
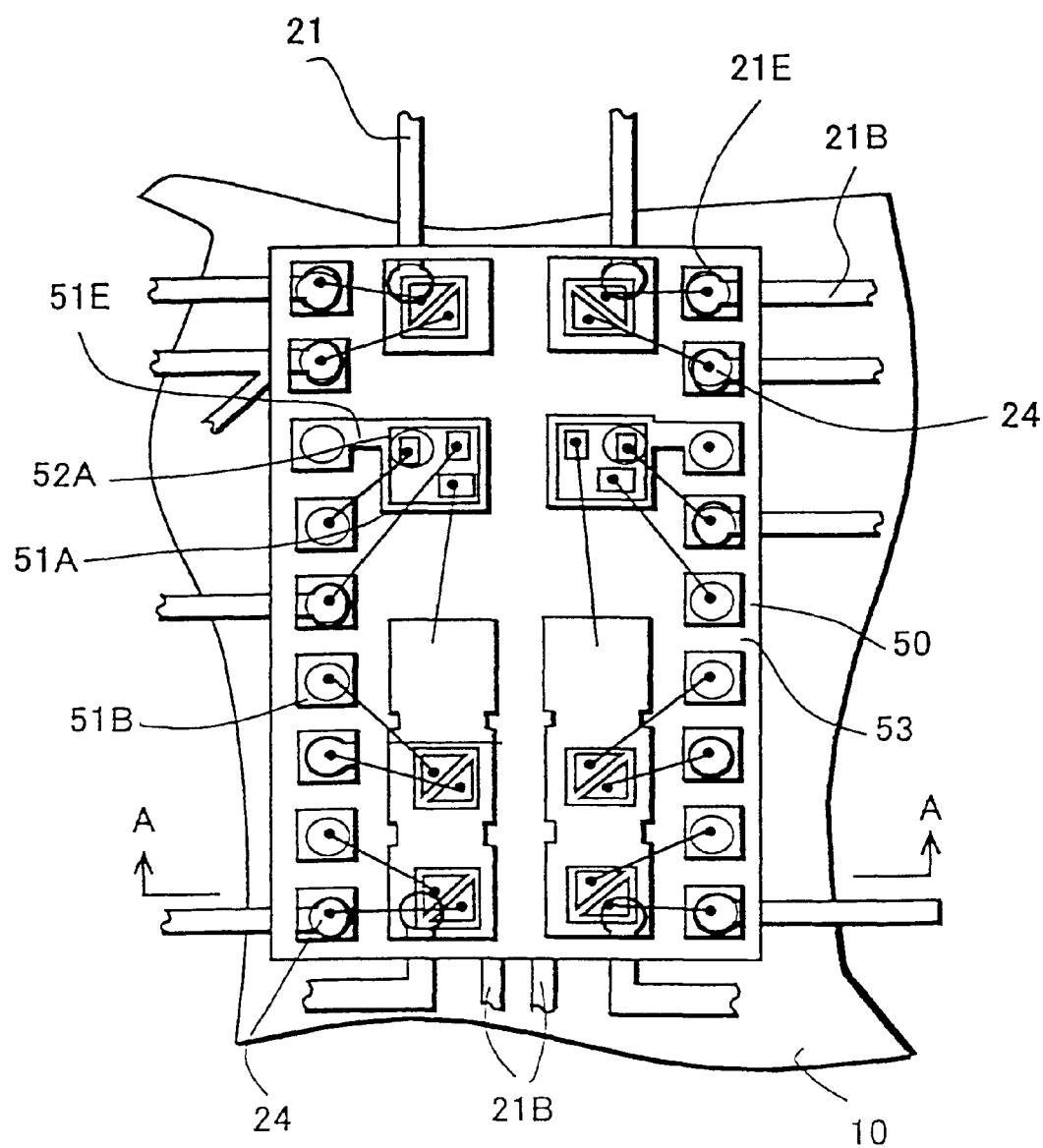
FIG. 2 is a view for explaining the configuration of a mounting board and a semiconductor device as shown in FIG. 1.

The conductive pattern 21 is composed of a die pad 21A, an interconnect 21B, a bonding pad 21C, an electrode 21D for the passive element, an electrode 21E for fixing the semiconductor devices 30A, 31A, 32, 33A, 34A and 38, an interconnect 21B integrally provided with the electrode 21E (as shown in FIG. 2 as a matter of convenience), and an external connecting electrode 21F for the outside lead-out. Also, a bare chip 40 is the BIP type power transistor, and a bare chip 41 is the power-MOS. A passive element 23 is the chip resistor, and a passive element 24 is the chip condenser. Further, a fine metal wire 42 is the large diameter (300 μm) Al wire, and a fine metal wire 43 is the small diameter (150 μm) Al wire.

Figure 19:
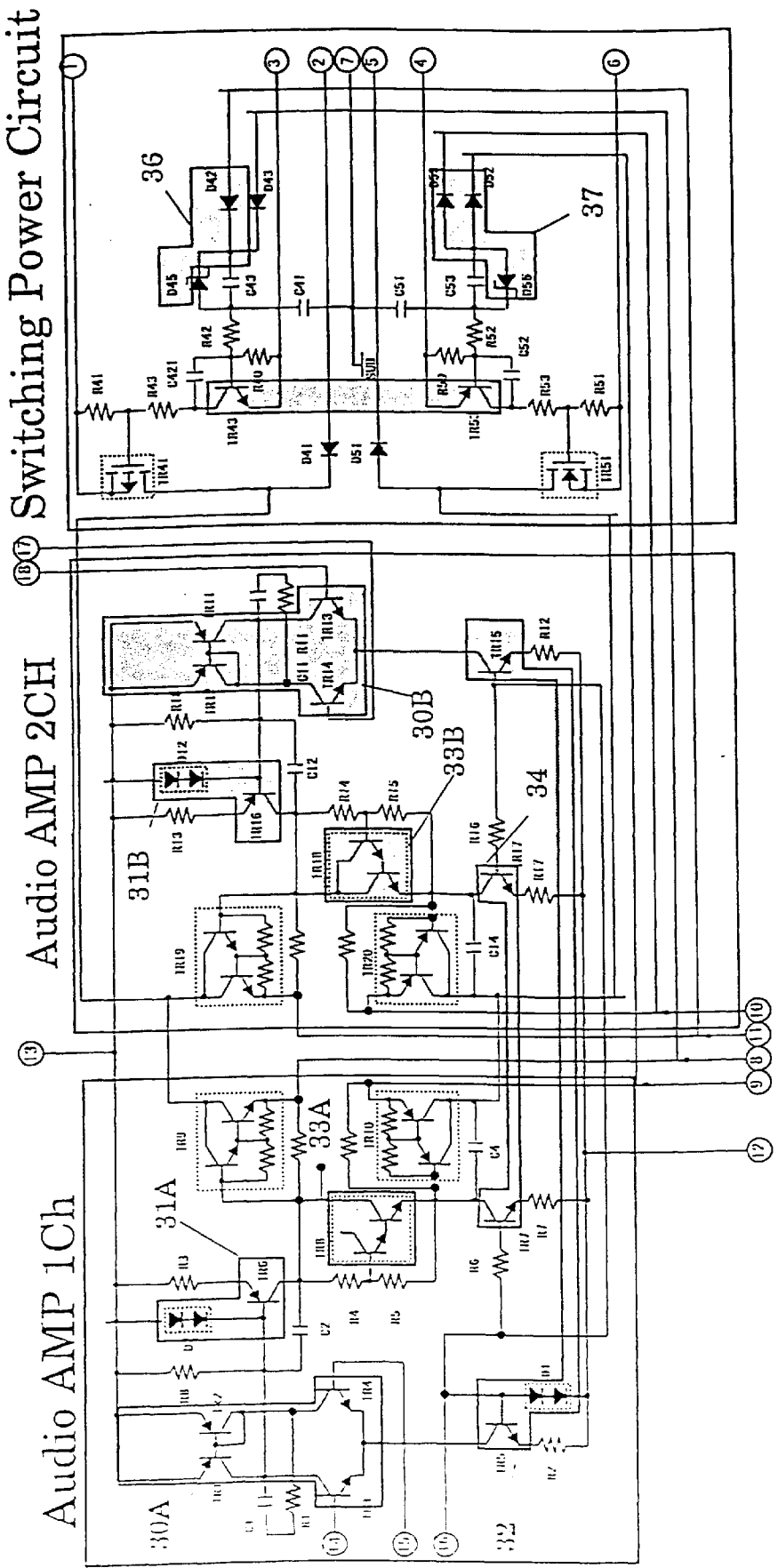
FIG. 19 is a view for illustrating one example of a circuit to be mounted on the hybrid integrated circuit device.

A feature of the present invention resides in the semiconductor devices 30A, 31A, 32, 33A, 34A, and 38. These semiconductor devices are enclosed by the bold line. Herein, a circuit as shown in FIG. 19 is adopted as one example, in which this circuit has various small signal type circuits packaged. That is, the fine metal wire for use with the small signal type circuit may be small diameter, and the small diameter fine metal wire and the semiconductor element are all packaged as the semiconductor device. Hence, the assembling operation on the mounting board can be performed by mounting the semiconductor device, without the bonding of small diameter wire. Also, since a plurality of semiconductor elements are packaged, the die bonding can be greatly lessened. This semiconductor device can also have the passive element packaged. If the passive element is contained in one package, there is less operation of mounting the passive elements.

In the assembling process, no bonding apparatus of Au is necessary, and it is unnecessary to place the mounting board on the bonding apparatus with the considerable steps.

Referring now to FIGS. 2 to 19, a semiconductor device as one package will be described below. Herein, a semiconductor device 38 located on the lower right side of FIG. 1 will be discussed.

FIG. 2 is a plan view of the semiconductor device 38, and FIG. 3 is a view illustrating three types of structures for this thin type semiconductor device 38. Moreover, FIGS. 4 to 9 are views for explaining a manufacturing method of this semiconductor device. FIGS. 10 to 18 are views for explaining the semiconductor device formed on the basis of the left-hand circuit. FIG. 19 is a circuit diagram for explaining a circuit on the mounting board 10.

Explanation of Semiconductor Device

Figure 9A:
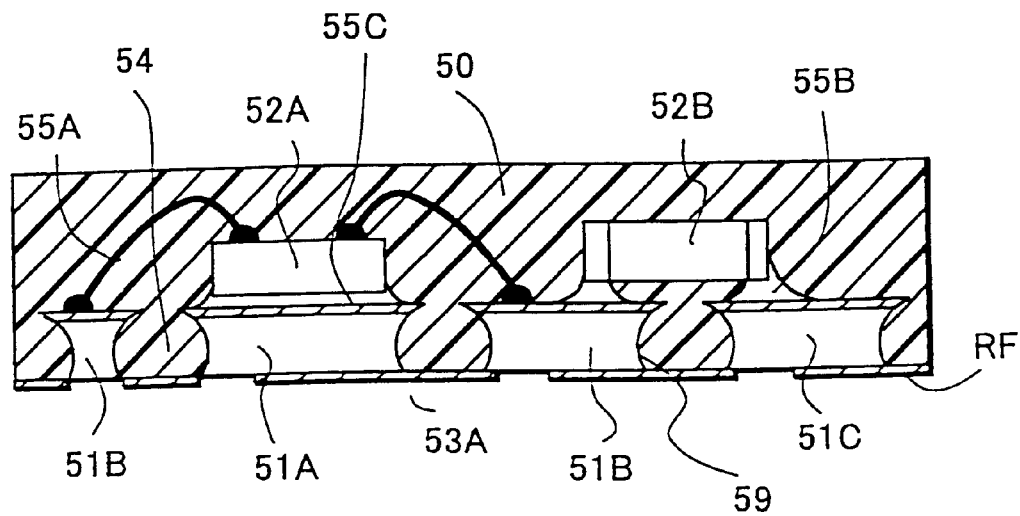
FIG. 9 is a view for explaining the manufacturing method of the semiconductor device of the invention.

In FIG. 9, a semiconductor device 53 is adopted in this invention. First of all, a specific structure of a first semiconductor device 53A will be described below with reference to FIG. 9A. This semiconductor device 53A has the conductive paths 51A to 51C buried into an insulating resin 50, a semiconductor chip 52A fixed on a conductive path 51A, and a passive element 52B fixed on the conductive paths 51B, 51C, as required. And the conductive paths 51A to 51C are supported by the insulating resin 50.

This structure is constituted of the semiconductor chip 52A, the circuit element 52B composed of the passive element and/or the active element, a plurality of conductive paths 51A, 51B, 51C, and the insulating resin 50 for burying the conductive paths 51A, 51B, 51C. A trench 54 is provided between the conductive paths 51 and filled with this insulating resin 50. And the conductive paths 51A to 51C are supported by the insulating resin 50.

The insulating resins for use may include a thermosetting resin such as epoxy resin, and a thermoplastic resin such as polyimide resin, and polyphenylene sulfide. The insulating resins may be all employed so long as they can be hardened with a mould, or coated by dipping or application. Also, the conductive paths 51 may be formed using a conductive foil made of Cu as a principal material, a conductive foil made of Al as a principal material, a conductive foil made of Fe—Ni alloy, an Al—Cu laminate, or an Al—Cu—Al laminate. In particular, the Al—Cu—Al laminate has a strong structure against the warp. Of course, other conductive materials may be used. In particular, the conductive materials that can be etched, the laser evaporable materials, or the relatively soft substances that allow the press formation of the trench 54 may be preferable.

Connecting means for the semiconductor element 52A and the circuit element 52B may be a fine metal wire 55A, a conductive ball made of the brazing material, a flat conductive ball, a brazing material 55B such as solder, a conductive paste 55C such as Ag paste, a conductive film or an anisotropic conductive resin. These connecting means may be selected depending on the kind of semiconductor element or circuit element 52, and the packaging form. For example, for a bare semiconductor chip, the connection between the surface electrode and the conductive path 51B is made by the fine metal wire 55A, or for the CSP or SMD, a solder ball or solder bump may be chosen. Also, the chip resistor or chip condenser may be connected by the solder 55B. If mounted face down in the semiconductor device, which can be packaged substantially in chip size, because no fine metal wire being employed.

For fixing the semiconductor element 52A with the conductive path 51A, a conductive film is used. Herein, at least one layer of conductive film may be required.

The materials for this conductive film may include Ag, Au, Pt, Pd, Ni or a brazing material. This conductive film can be provided by deposition under low or high vacuum, such as evaporation, sputtering or CVD, plating, sintering or application.

For example, Ag can be bonded with Au and the brazing material. Hence, if there is the Au film on the back face of chip, the semiconductor chip can be directly subjected to thermocompression bonding by applying an Ag film, an Au film or a solder film on the conductive path 51A, or the chip can be fixed via the brazing material such as solder. Herein, the conductive film may be formed on the uppermost layer among the multiple layers of conductive film. For example, two layers of Ni film and Au film are applied in order on the conductive path 51A of Cu, three layers of Ni film, Cu film and solder film are applied in order, or two layers of Ag film and Ni film are applied in order. Explanations for other kinds of conductive film, and lamination structures may be conceived, but are omitted here.

In this semiconductor device 53A, because the conductive path 51 is supported by the insulating resin 50 that is a sealing resin, there is no need of having a support board for supporting the conductive path by fixing. Therefore, the semiconductor device 53A is constituted of the conductive path 51, the elements 52, and the insulating resin 50. This constitution is a feature of the present invention. The conductive path of the conventional circuit device is supported by the support board (e.g., a printed circuit board, a ceramic substrate or a flexible sheet) and fixed, or supported by a lead frame, whereby an additional structure that is unnecessary in essence is added. However, this semiconductor device is constituted of a minimum amount of elements as required, without need of the support board, whereby there is a feature of thin type and low price.

Besides the above constitution, the insulating resin 50 for coating the circuit element 52 and being filled in the trench 54 between the conductive paths 51 for integral support is provided.

Between the conductive paths 51, there is provided the trench 54, which is filled with the insulating resin 50, bringing about a merit of providing the insulation between the conductive paths 51.

The insulating resin 50 supports integrally the elements 52, and the conductive path by covering the elements 52 and being filled in the trench 54 between the conductive paths 51, with a back face of the conductive paths 51 exposed.

One of the features of the invention is that the back face of this conductive path is exposed. The back face of the conductive path can be subjected to connection with the outside, in which there is a feature that no through hole for use in the printed circuit board employing the support board is required.

In the case where the semiconductor element 52A is directly fixed via the conductive film made of the brazing material, Au or Ag, the heat produced from the semiconductor element 52A can be transmitted to the mounting board via the conductive path 51A, because the back face of the conductive path 51 is exposed. It is particularly effective for the semiconductor chips to enable the improvement in the characteristics such as the increased drive current and so on, owing to the heat radiation. This is a point of the semiconductor device 53A of the invention, and will be described later.

Also, the semiconductor device 53A has such a structure that the bottom of the trench 54 is substantially flush with the back face of the conductive path 51. This structure is a feature of the invention, and since there is no difference in level on the back face of the conductive path 51, such a feature is provided that the semiconductor device 53 can be readily moved horizontally.

In the invention, in order to realize a multi-layer structure with the mounting board, an insulating film RF such as a solder resist is applied. And by exposing a part of the conductive path 51, the interconnect of the mounting board 10 is extended on the back face of the semiconductor device 53A. Since this semiconductor device is fixed on the mounting board 10, the conductive path 51 and the fine metal wire 55A work as the conventional jumping wire to realize a multi-layer structure. This will be described later.

Further, in the invention, the small signal type semiconductor element and/or the passive element for which the small diameter fine metal wire is employed are picked up, and packaged, as shown in FIGS. 10 to 18. Owing to the small signal type, the fine metal wire may be the small diameter Al or Au wire. Note that the Au wire of 40 μm is employed here.

The reason of employing the Au wire will be described below.

The reason is that the insulating resin is molded by transfer molding, and the Au wire is superior in the respect of being less deformation against the injection pressure. The Al wire is connected by wedge bonding, in which there are drawbacks of having a weak neck portion, requiring a wider bonding area than the Au wire, and increasing the size of the semiconductor device. Further, the Al wire has a drawback that the drawing direction is determined with respect to the wedge bonding part, as can be seen from FIG. 1 or 20. The Au wire is freely drawn in arbitrary direction owing to ball bonding, and has the merit that the bonding speed is faster than the Al bonder, no restriction is imposed on the position of the conductive path to be bonded, and the arrangement is made at will. Hence, the position of the conductive path to dispose the bonding pad can be determined in the empty area, enabling the shrinkage of the semiconductor device.

Explanation of Semiconductor Device 53B

Figure 9B:
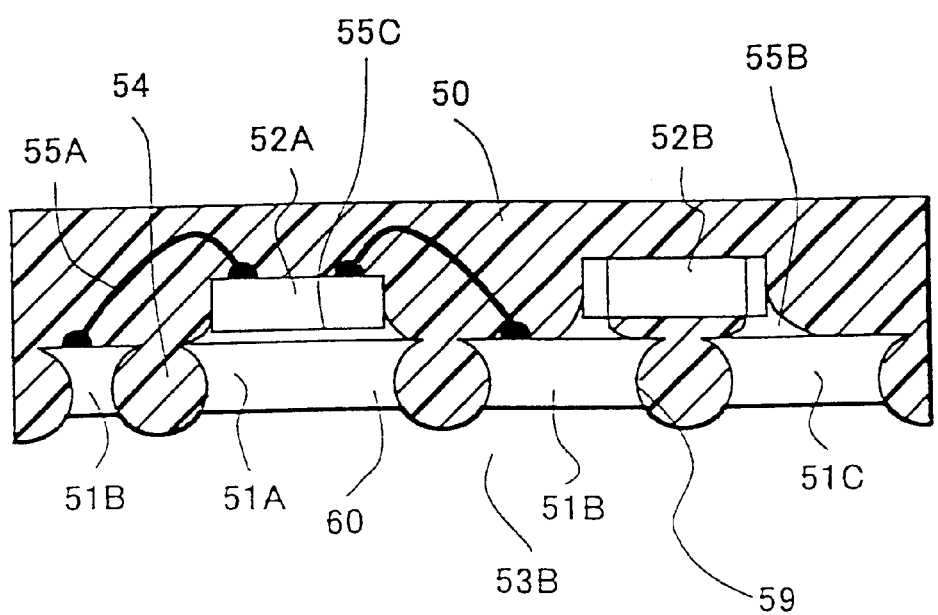

A semiconductor device 53B as shown in FIG. 9B has substantially the same constitution as the semiconductor device 53A as shown in FIG. 9A, except that the back face structure of the conductive path 51 is different. This different portion will be described below.

As will be seen from this figure, the back face of the conductive path 51 is recessed from the back face of the insulating resin 50 (or the back face of the insulating resin 50 filled in the trench 54). By taking this structure, the multi-layer interconnect is allowed. The details will be described later.

Explanation of Semiconductor Device 53C

Figure 9C:
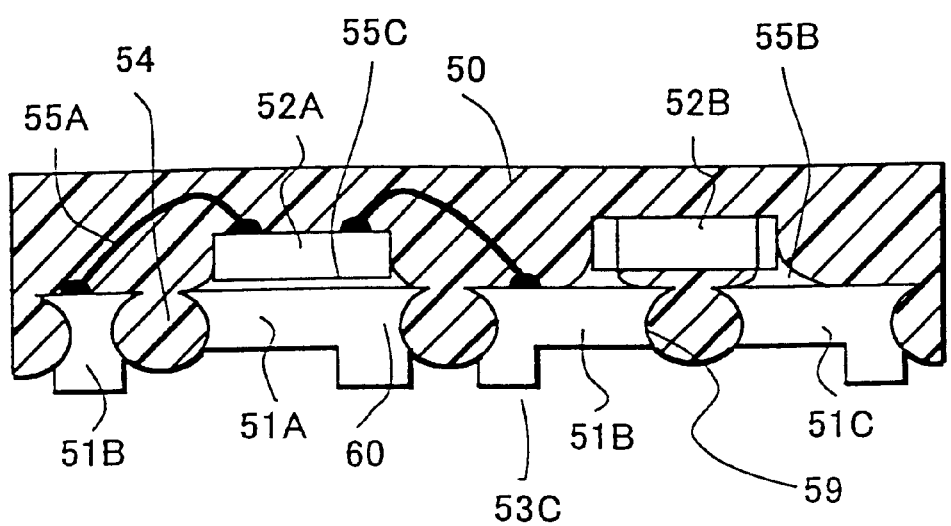

A semiconductor device 53C as shown in FIG. 9C has substantially the same constitution as the semiconductor devices 53A, 53B as shown in FIGS. 9A and 9B, except that the back face structure of the conductive path 51 is different. This different portion will be described below.

As will be seen from this figure, the back face of the conductive path 51 is protruded from the back face of the insulating resin 50 (or the back face of the insulating resin 50 filled in the trench 54). By taking this structure, the multi-layer interconnect is allowed. The details will be described later.

Explanation of a Manufacturing Method for Semiconductor Devices 53A to 53C

A manufacturing method of the semiconductor device 53 will be described below with reference to FIGS. 4 to 9.

Figure 4:
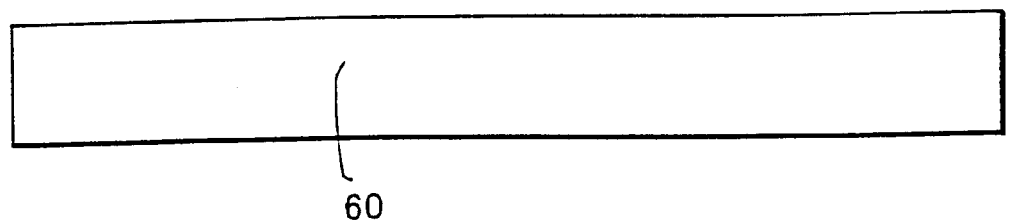
FIG. 4 is a view for explaining a manufacturing method of the semiconductor device of the invention.

First of all, a sheet conductive foil 60 is prepared as shown in FIG. 4. The material for this conductive foil 60 is chosen in consideration of the adhesion, bonding strength and plating property of the brazing material. This conductive foil 60 may be a conductive foil made of Cu as a principal material, a conductive foil made of Al as a principal material, a conductive foil made of Fe—Ni alloy, an Al—Cu laminate, an Al—Cu—Al laminate or Cu—Al—Cu laminate.

The thickness of the conductive foil is preferably about 35 to 300 μm in consideration of etching. Here, a copper foil having a thickness of 70 μm (2 ounces) was adopted. However, the copper foil may have fundamentally the thickness of greater than 300 μm, or smaller than 10 μm. As will be described later, it is necessary that a trench 61 shallower than the thickness of the conductive foil 60 may be formed.

The sheet conductive foil 60 rolled in a predetermined width may be prepared and carried in the ensuing steps, or the conductive foils cut in a predetermined size may be prepared and carried in the ensuing steps (see FIG. 4).

Subsequently, there is a step of removing the conductive foil 60 to be thinner than the thickness of the conductive foil 60, except for at least the region that becomes the conductive path 51.

Figure 5:
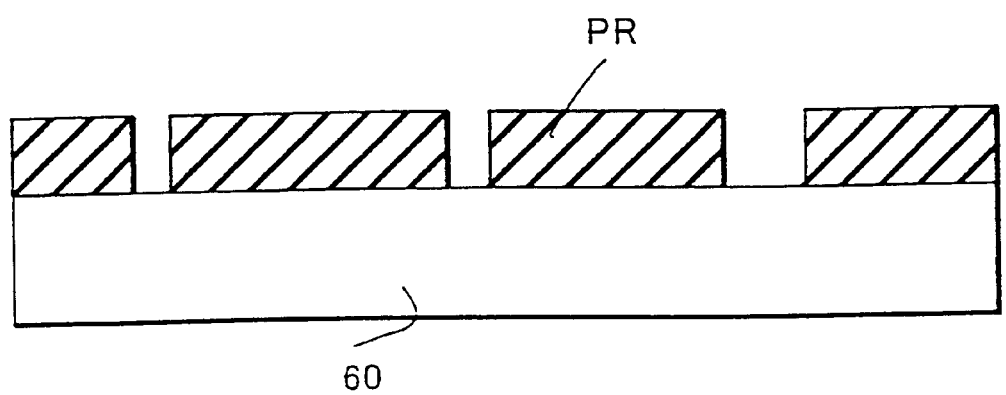
FIG. 5 is a view for explaining the manufacturing method of the semiconductor device of the invention.

Firstly, a photo-resist (anti-etching mask) PR is formed on the Cu foil 60, and patterned to make the conductive foil 60 exposed except for the region that becomes the conductive path 51 (see FIG. 5). Then the etching may be made via the photo-resist PR.

A trench 61 is formed by etching, for example, in a depth of 50 μm, and its side face is rough, so that the adhesive property with the insulating resin 50 is enhanced.

A side wall of the trench 61 has a different structure depending on the removing method. This removing step may be performed by wet etching, dry etching, laser evaporation, or dicing. Or it may be performed by press. In the case of wet etching, the etchant may be ferric chloride or cupric chloride principally. The conductive foil is dipped in this etchant, or showered by this etchant. Herein, the wet etching is typically non-anisotropic etching, and the side face of the trench 61 has a curved structure as shown in FIG. 6B.

In the case of the dry etching, the anisotropic or non-anisotropic etching can be made. At present, it is said that Cu can not be removed by reactive ion etching, but can be removed by sputtering. The anisotropic or isotropic etching may be possible depending on the sputtering conditions.

More recently, halide is used for performing the anisotropic etching to Cu in such a way that JP 3105547 discloses in its specification. According to the method, the introduced halogen basis is activated by the strongly-intensified light so that a non-masked portion is converted into a halide reaction product which might be evaporated by increasing temperature enough to do it or removed by cleaning it. Therefore, more precise patterning can be achieved in this invention by introducing this sort of method.

In the laser, the trench can be formed by directly radiating a laser beam. In this case, the side face of the trench 61 becomes rather straight.

In the dicing, a tortuous complex pattern can not be formed, but a grid-like trench can be formed.

Figure 6A:
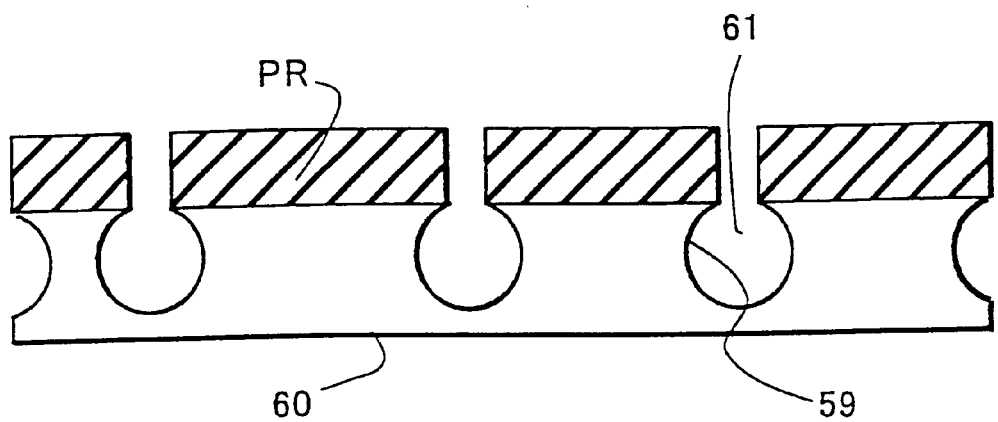
FIG. 6 is a view for explaining the manufacturing method of the semiconductor device of the invention.
Figure 6B:
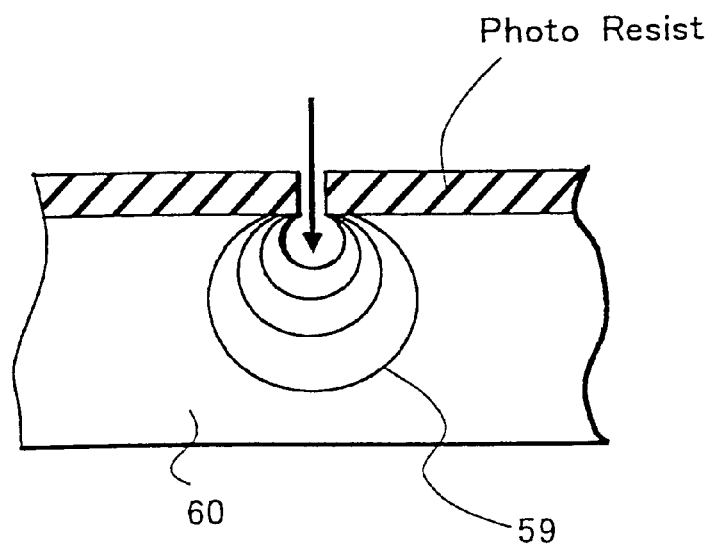

In FIG. 6, a conductive film that is corrosion resistant to the etching solution may be selectively covered, instead of the photo-resist PR. If the conductive film is selectively covered on a portion that becomes the conductive path, this conductive film becomes an etching protective film, and the trench can be etched without the use of the resist. The materials for this conductive film may include Ni, Ag, Au, Pt and Pd. And the corrosion-resisting conductive film has a feature that it can be directly used as the die pad or bonding pad.

For example, an Ag film can be bonded with Au, and the brazing material. Hence, if an Au film is coated on the back face of chip, the chip can be directly subjected to thermocompression bonding with the Ag film located on the conductive path 51, and can be fixed via the brazing material such as solder. Also, since the Au fine wire can be bonded with the Ag conductive film, the wire bonding can be effected. Accordingly, there is the merit that the conductive film can be directly utilized as the die pad or bonding pad (see FIG. 6).

Figure 7:
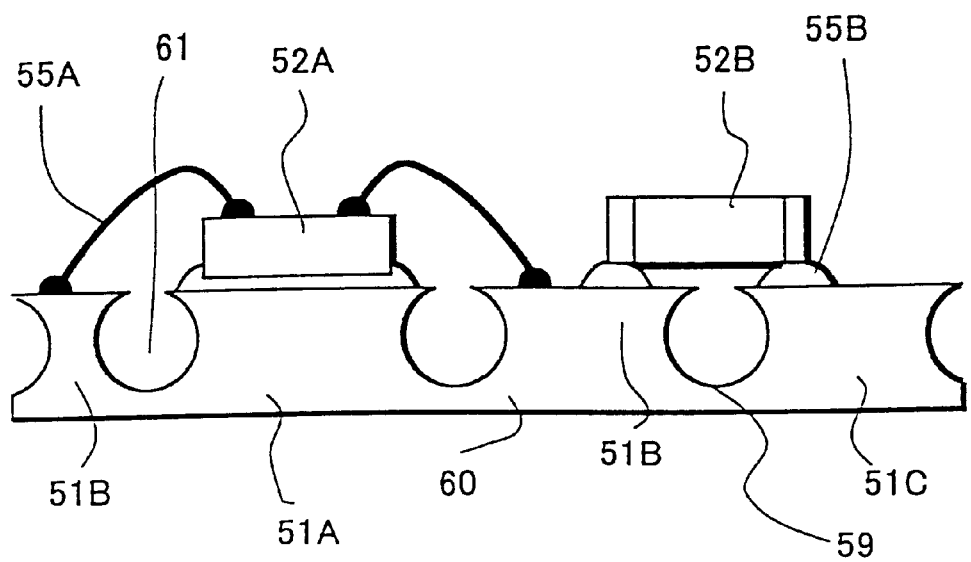
FIG. 7 is a view for explaining the manufacturing method of the semiconductor device of the invention.

After that, there is a step of electrically connecting the circuit element 52 to the conductive foil 60 having the trench 61 formed, as shown in FIG. 7.

The circuit element 52 may be the semiconductor element 52A such as a transistor, a diode, or an IC chip, or the passive element 52B such as a chip condenser or a chip resistor. A facedown type semiconductor element such as CSP, BGA, SMD and so on can be also mounted, with the increased thickness.

Herein, the transistor chip 52A as a bare semiconductor chip is die bonded on the conductive path 51A, an emitter electrode and the conductive path 51B, and a base electrode and the conductive path 51B being connected via the Au wire 55A by thermocompression ball bonding.

Note that the Al wire may be used and fixed by wedge bonding with the ultrasonic wave. Reference numeral 52B denotes a active element and/or an passive element such as a chip condenser. Herein, the chip condenser is employed and fixed by the brazing material such as solder or the conductive paste 55B (see FIG. 7).

Figure 8:
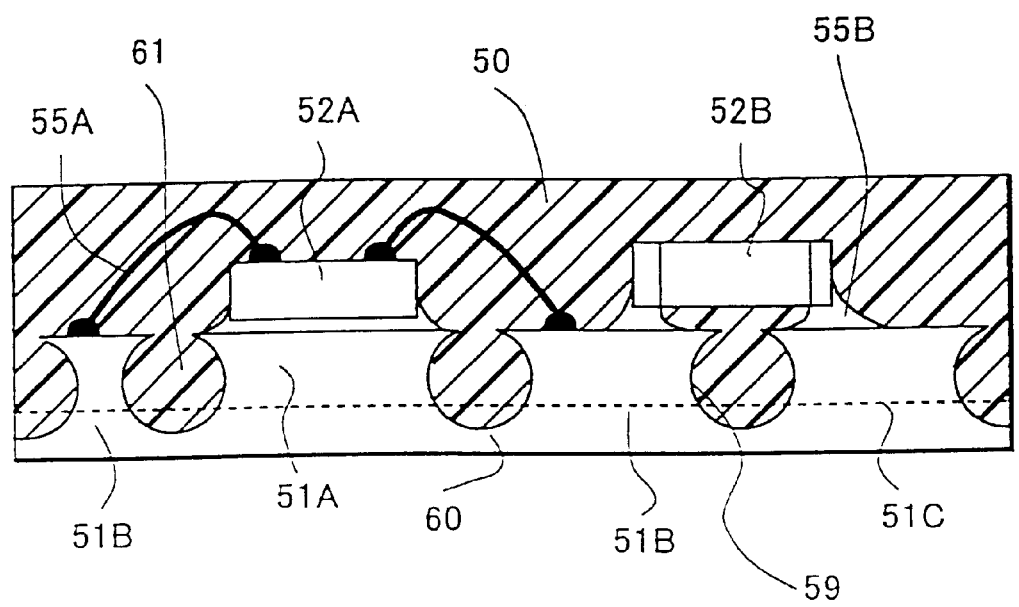
FIG. 8 is a view for explaining the manufacturing method of the semiconductor device of the invention.

Further, there is a step of attaching the insulating resin 50 to the conductive foil 60 and the trench 61, as shown in FIG. 8. This step is effected by transfer molding, injection molding, or dipping. The resin materials include the thermosetting resin such as epoxy resin which is subjected to transfer molding, and the thermoplastic resin such as polyimide resin or polyphenylene sulfide which is subjected to injection molding.

In this embodiment, the thickness of the insulating resin coated on the surface of the conductive foil 60 is adjusted to be about 100 μm from the top portion of the circuit element. This thickness may be increased or decreased in consideration of the strength.

A feature of this step is that the conductive foil 60 which becomes the conductive path 51 serves as a support substrate till the insulating resin 50 is covered. For example, in the CSP employing a printed circuit board or a flexible sheet, the support substrate (printed circuit board or flexible sheet), which is unnecessary in essence, is employed to form the conductive path. However, in the present invention, the conductive foil 60 that becomes the support substrate is a required member for the conductive path. Therefore, there is the merit that the work can be done by omitting the constituent material as much as possible, and the costs can be reduced. Since there is no conductive foil in the dicing line section, the blinding of blade can be prevented. Further, if a package employing the ceramic substrate is molded and diced, the blade may severely break or wear. However, in the invention, since the resin is only diced, there is the merit that the blade has a longer life.

Since the trench 61 is shallower than the conductive foil, the conductive foil 60 is not separated individually as the conductive paths 51. Accordingly, the invention has a feature that the sheet conductive foil 60 can be handled as one piece from mounting the circuit elements to the dicing, and particularly in molding the insulating resin, the work of carrying the conductive foil 60 to the mold, and attaching it on the mold is facilitated (see FIG. 8).

Subsequently, there is a step of removing the back face of the conductive foil 60 chemically and/or physically to separate the conductive paths 51. This removing step is performed by polishing, grinding, etching or metal evaporation of laser.

In the experiments, the overall surface is ground about 30 μm thick by the polishing apparatus or grinding apparatus, with the insulating resin 50 exposed from the trench 61. This exposed face is indicated by the dotted line in FIG. 8. To extend the interconnect on the mounting board, an insulating film RF is formed on the back face of the semiconductor element 53A as shown in FIG. 9A. As a result, the conductive paths 51 having a thickness of about 40 μm are separated.

In order to adopt a structure wherein the insulating resin 50 is exposed, and the back face of the conductive path 51 is recessed from the back face of the insulating resin 50, as shown in FIG. 9B, the overall surface of the conductive foil 60 may be etched.

Further, the etching may be performed by providing an anti-etching mask on the back face of the conductive path to have a part of the conductive path exposed, as shown in FIG. 9C. In this case, the conductive path 51 is protruded from the back face of the insulating resin 50.

In either structure, the back face of the conductive paths 51 is exposed from the insulating resin 50. And the trench 61 is ground, resulting in the trench 54 (see FIG. 9).

Lastly, a conductive material such as solder is covered on the exposed conductive paths 51, as required. Further, taking into consideration the multi-layer structure of the mounting board, the insulating resin is covered on the back face of the semiconductor device 53, as required, to complete the semiconductor device.

In the case where a conductive film is applied on the back face of the conductive paths 51, the conductive film may be formed in advance on the back face of the conductive foil of FIG. 4. In this case, the conductive film may be selectively applied on a portion corresponding to the conductive path. The applying method may be made by plating, for example. This conductive film should be made of a material that is resistant to the etching. In the case where the conductive film or photo-resist is employed, the conductive paths 51 can be separated only by etching, without polishing, to realize a structure of FIG. 9C.

With this manufacturing method, a semiconductor chip and a chip condenser are only mounted on the conductive foil 60, but may be arranged in a matrix form as a unit.

Figure 13A:
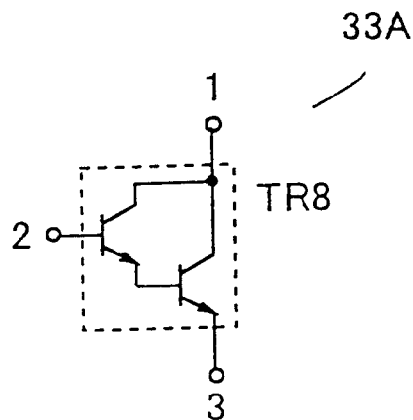
FIG. 13 is a view for explaining the semiconductor device of the invention.
Figure 13B:
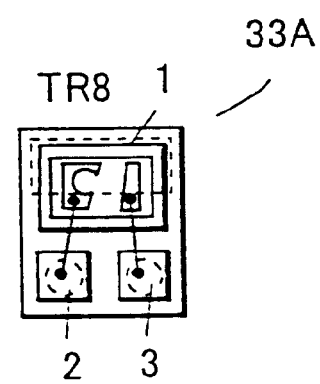
Figure 14A:
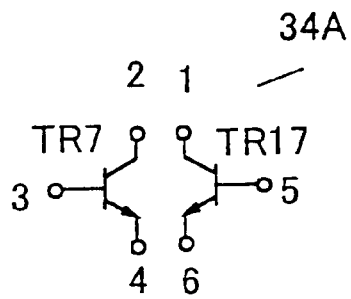
FIG. 14 is a view for explaining the semiconductor device of the invention.
Figure 14B:
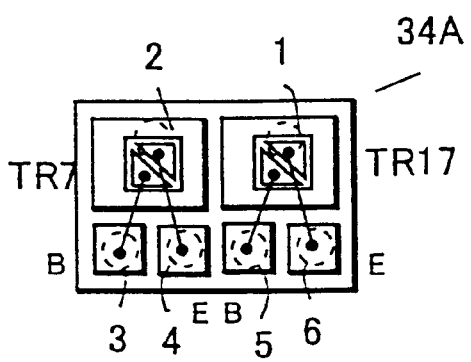

One transistor, diode, IC or LSI may be mounted as the active element (semiconductor chip) and formed as a discrete type (see FIGS. 13 and 14).

Figure 11A:
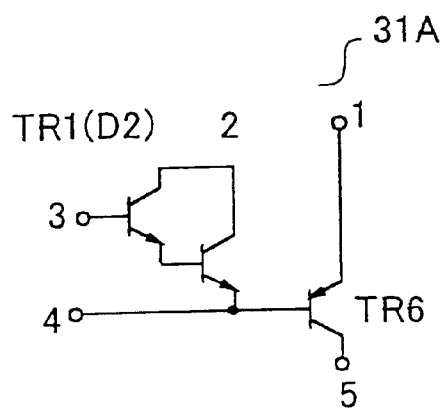
FIG. 11 is a view for explaining the semiconductor device of the invention.
Figure 11B:
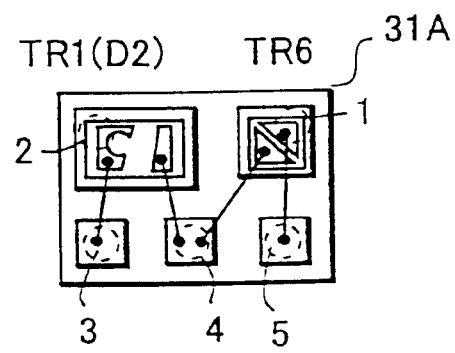
Figure 12A:
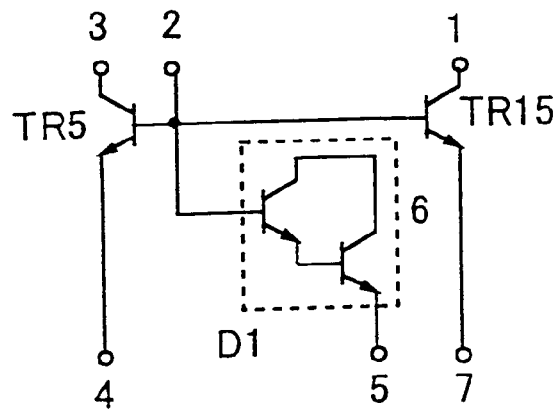
FIG. 12 is a view for explaining the semiconductor device of the invention.
Figure 12B:
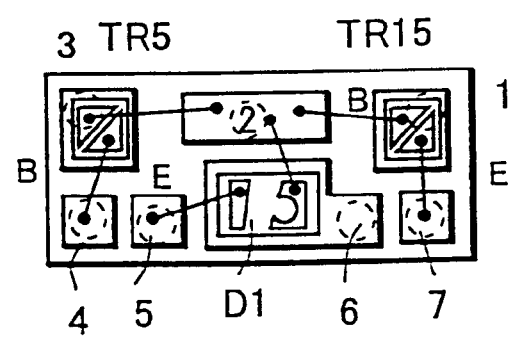

A plurality of active elements may be mounted to provide a composite type semiconductor device (see FIGS. 11, 12 and 14).

Further, a transistor, diode, IC or LSI as the active element (semiconductor chip) and a chip resistor or chip condenser as the passive element may be mounted, and the interconnect formed as the conductive paths, to realize a hybrid IC type (see FIGS. 10, 12, 16, 17 and 18).

In the arrangement like a matrix, after the conductive paths are separated, the semiconductor devices are divided individually using the dicing apparatus.

With the manufacturing method, the conductive paths 51 are buried into the insulating resin 50, and the semiconductor device 53 can be produced in which the back face of the insulating resin 50 is substantially flush with the back face of the conductive paths 51.

This manufacturing method has a feature that the insulating resin 50 is utilized as the support substrate, allowing the separation work of the conductive paths 51. The insulating resin 50 is a material required for burying the conductive paths 51, and no support substrate is necessary. Accordingly, the semiconductor device can be manufactured with the least amount of material at the reduced costs.

The thickness of the insulating resin formed on the surface of the conductive paths 51 can be adjusted when the insulating resin is attached. Accordingly, the thickness of the semiconductor element 53 may be increased or decreased depending on the circuit element to be mounted. Herein, the semiconductor device is produced in which the conductive paths 51 having a thickness of 40 μm and the semiconductor element are buried into the insulating resin 50 having a thickness of 400 μm.

Explanation of a Packaged Structure on the Mounting Board

Figure 3A:
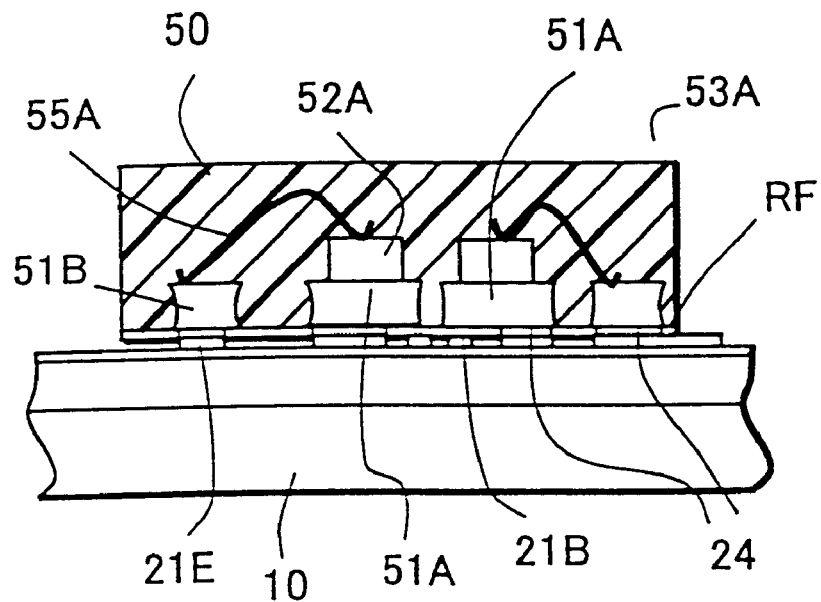
FIG. 3 is a cross-sectional view of the mounting board and the semiconductor device as taken along the A—A line in FIG. 2.
Figure 3B:
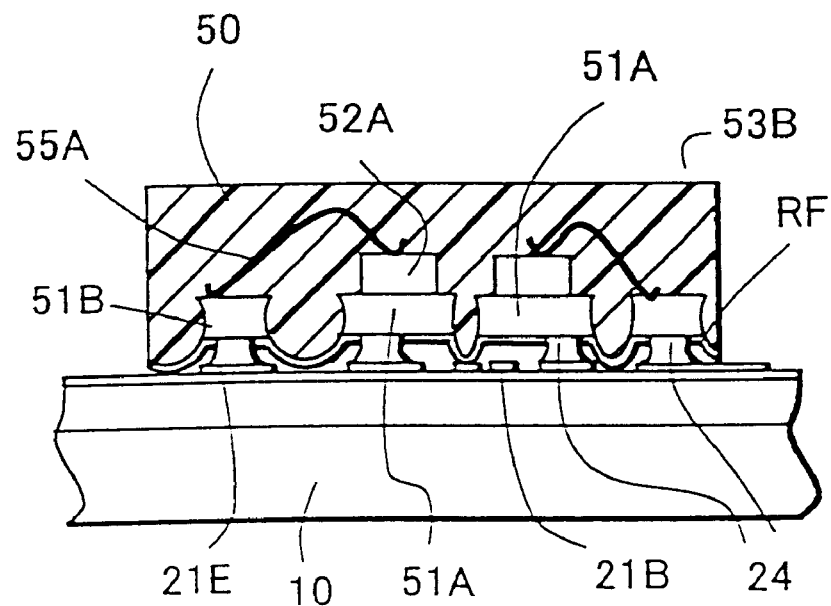
Figure 3C:
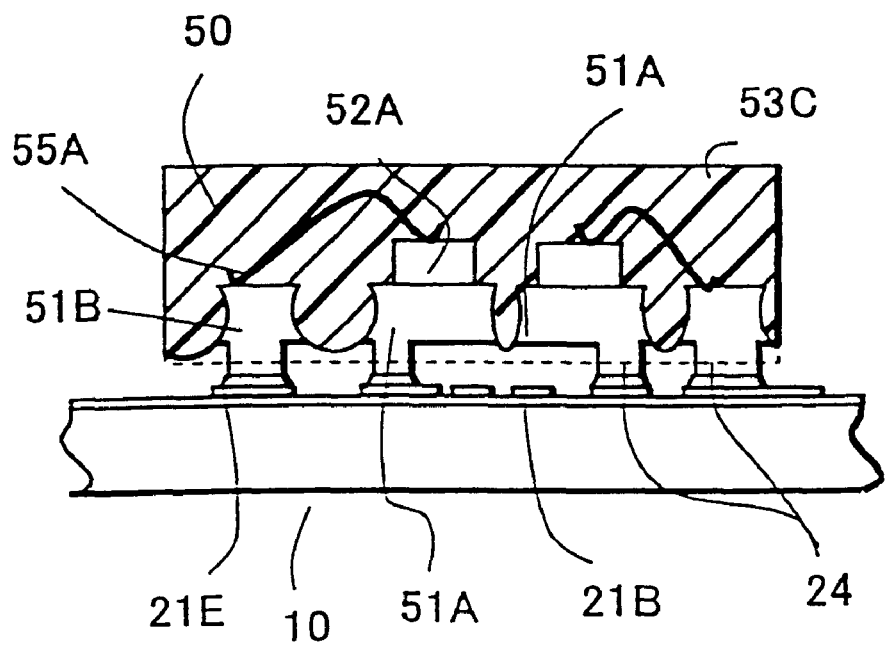

Referring now to FIGS. 2 and 3, a hybrid integrated circuit device of the present invention will be described below. FIG. 2 is a plan view of the hybrid integrated circuit device, and FIG. 3 is a cross-sectional view of the hybrid integrated circuit device taken along the A—A line in FIG. 2. The structures in which the semiconductor device 53A of FIG. 9A, the semiconductor device 53B of FIG. 9B and the semiconductor device 53C of FIG. 9C are fixed on the mounting board 10 are illustrated in FIGS. 3A, 3B and 3C, respectively.

First of all, the mounting board 10 will be described below. The mounting board 10 for mounting the semiconductor device 53 as above mentioned may be a printed circuit board, a ceramic substrate, a flexible sheet substrate or a metallic substrate. Since this mounting board 10 has a conductive pattern 21 formed on the surface, at least the surface of the substrate is insulated in consideration of the electrical insulation. Since the printed circuit board, the ceramic substrate and the flexible sheet substrate are made of an insulating material themselves, the conductive pattern 21 may be directly formed on the surface. However, in the case of the metallic substrate, the insulating material is applied at least on the surface of the metallic substrate, and the conductive pattern 21 is applied thereon. In this embodiment, the conductive pattern 21 is formed on the mounting board 10, and the conductive pattern supported by the insulating resin 50 for the semiconductor device 53 is considered as the conductive path 51.

As can be seen from FIG. 1, the conductive pattern 21 may include a die pad 21A, an interconnect 21B, a bonding pad 21C, an electrode 21D for fixing a chip resistor 23 and a chip condenser 24, an electrode 21E for fixing the semiconductor device 53 (not seen in FIG. 1, and shown in FIGS. 2 and 3), and an outside connecting electrode 21F as required. The electrode 21E for fixing the semiconductor device 53 and the interconnect 21B integrally provided therewith are indicated by the bold line in FIG. 2.

On the other hand, in the semiconductor device 53, the conductive paths 51 supported by the insulating resin 50 include a conductive path 51A having a semiconductor chip 52A fixed, a conductive path 51B that becomes a bonding pad, and a conductive path 51E as the interconnect that is provided integrally with the conductive paths 51A, 51B.

An elliptical part in FIG. 2 represents a contact portion 24 to be electrically connected with the electrode 21E on the mounting board 10 on the back face of the semiconductor device 53. And owing to this contact portion 24 and the back face structure as shown in FIGS. 3A to 3C, the interconnect 21B of the mounting board 10 can be extended on the back face of the semiconductor device 53.

The structure of the semiconductor device 53 has been already described, and its detailed explanation is omitted here.

Back face structure of semiconductor device 53A as shown in FIG. 3A

On the back face of the semiconductor device 53A, an insulating film RF is provided, and the contact portion 24 is exposed via this insulating film RF. The semiconductor device 53 has such a structure that all the conductive paths are essentially exposed out of the back face, as can be seen from FIGS. 8 and 9, but the conductive paths 51 can be covered with the insulating film RF.

Hence, there is a feature that the interconnect 21B formed on the mounting board 10 can be extended on the back face of the semiconductor device 53.

A first feature of the invention is that the conductive path 51A sealed by the insulating resin 50 together with the semiconductor device 53 and having the semiconductor chip 52A fixed is connected with the conductive path 21 on the mounting board 10.

As will be apparent from the cross-sectional view of FIG. 3, the heat generated by the semiconductor chip 52A is radiated via the conductive path 51A to the conductive path 21E on the mounting board 10. The conductive path 21E is a conductive material that is excellent in heat conductivity, so that the heat of the semiconductor chip 52A can be passed to the mounting board 10. Also, the heat transferred to the fine metal wire 55A can be conveyed to the conductive path via the conductive path 51B shaped like a rectangular parallelepiped and having a relatively large size. The conductive path 21 is integral with the interconnect 21B, and the heat can be radiated via the interconnect 21B to the outer atmosphere. Accordingly, it is possible to prevent the temperature rise of the semiconductor chip 10, and increase the drive current by the amount corresponding to the suppressed rise in temperature.

Particularly, if the mounting board 10 is constituted of a metallic substrate, the heat of the semiconductor chip 52A can be passed via the conductive path 21 to the metallic substrate. This metallic substrate serves as a large heat sink or a heat radiator, and can further suppress the rise in temperature of the semiconductor chip as compared with other mounting boards as previously described.

In the case of the metallic substrate, an insulating material is applied on the surface in view of the short-circuiting between the conductive paths, and the material may be inorganic or organic. Herein, epoxy resin or polyimide resin may be employed. This material can be formed as thin as 30 to 300 μm, so that the thermal resistance can be made relatively small, but if the filler such as silica or alumina is mixed into the insulating resin, the thermal resistance can be further reduced.

A second feature resides in the insulating film RF. By covering the insulating film RF to have the contact portion 24 exposed, the interconnect 21B can be extended under the semiconductor device 53A. Hence, the conductive path 51 and the fine metal wire 55A of the semiconductor device 53A are used to realize a multi-layer interconnect structure, whereby the interconnect on the mounting board 10 can be simplified. The conventional hybrid IC as shown in FIG. 20 and a hybrid IC as shown in FIG. 1 are designed to have the same substrate size. From the comparison between the respective patterns, the hybrid IC of the invention has coarser interval between interconnect patterns, and a reduced number of minute patterns. This is because the conductive path 51 on the semiconductor device 53 is connected via an opening portion of the insulating film RF to the conductive pattern 21 on the mounting board 10, and the other portion is covered with the insulating film RF. This conductive path can be also formed as the interconnect, allowing the crossover, whereby the multi-layer structure with the fine metal wire is realized. Hence, if the semiconductor device is prepared beforehand in a step of mounting the elements on the mounting board, the number of bondings for the crossover to be employed on the mounting board can be reduced. Further, the complex interconnect pattern to avoid the crossover can be lessened on the mounting board.

Further, a third feature of the invention resides in the fine metal wire, allowing the reduction of the bonding process. In the hybrid IC of FIG. 20, the wire diameter of the fine metal wire is separately used depending on the small signal type semiconductor element or the large signal type semiconductor element. Namely, the fine metal wire for the small signal type semiconductor element is indicated by the thin solid line, and uses an Au wire of 40 μm. And this Au wire is subjected to ball bonding. The fine metal wire for the large signal type semiconductor element is indicated by the bold line, and uses an Al wire of 100 to 300 μm. Herein, the Al wire of 150 μm was employed for the power MOS gate electrode and as the jumping wire, and the Al wire of 300 μm was employed for the power MOS source electrode, the power transistor base and emitter electrodes and as the jumping wire. And these Al wires are subjected to stitch bonding. Note that the Au wire may be substituted for the Al wire.

This invention has a feature in that the semiconductor device consists of a semiconductor element connected by the Au wire, a bonding pad to which the Au wire is connected, an interconnect 51E extended integrally with the bonding pad, and a die pad, which are sealed by the insulating resin 50 integrally.

The semiconductor elements employing the Au fine metal wire are all prepared as the semiconductor device 53, so that the bonding of Au on the mounting board 10 is not required, leading to the merit of allowing the reduction of the bonding process. Further, it is possible to greatly reduce the number of mounting the circuit elements including the semiconductor elements. Conventionally, three sorts of fine metal wires were employed and three sorts of bonders were prepared for bonding the fine metal wires. However, in the invention, there is the merit that the bonder of the Au wire can be omitted. Therefore, the installation can be simplified, and the mounting board is only placed on two sorts of bonders, resulting in the simplified process.

In particular, the semiconductor device can be formed as a discrete element, a composite element or a hybrid IC. Theoretically, all the circuit elements can be incorporated into the semiconductor device, significantly reducing the number of fixing the elements on the mounting board.

A fifth feature of the invention is that the semiconductor device as small as 0.45×0.5 mm, 0.25 mm thick, can be used, allowing the reduction of the costs.

In the conventional example as described above, even if a cheap semiconductor chip as small as 0.45×0.5 mm, 0.25 mm thick is employed, the solder is sucked up on the side face of chip, causing a short-circuit.

However, in the present invention, an Au bump is applied on the back face of the semiconductor chip 52A, and the conductive path 51 and the semiconductor chip 52A are secured together via this bump to complete a semiconductor device 53. Then this semiconductor device 53 is fixed on the mounting board 10. Accordingly, even if the semiconductor device 53 is fixed using the solder, the side face of the semiconductor chip 52A is covered by the insulating resin 50. Therefore, the short-circuit problem as previously described can be eliminated, so that the small semiconductor chip can be utilized.

Back face structure of semiconductor device 53B as shown in FIG. 3B

The semiconductor device 53B is substantially the same as the semiconductor element 53A of FIG. 3A, except that the conductive path 51 exposed on the back face of the semiconductor device 53B is recessed from the insulating resin 50.

A feature of the invention resides in the recess of the conductive path 51. Owing to this recess, the conductive path 51 of the semiconductor device 53B and the conductive pattern 21 on the mounting board 10 can possess a desired interval. Accordingly, the interconnect 21B can be extended under the semiconductor device 53B, like the semiconductor device 53A. Hence, by making use of the conductive path 51 and the fine metal wire of the semiconductor device 53B, a multi-layer interconnect structure can be realized, with the simplified interconnect on the mounting board 10.

Note that the insulating film RF may be applied on the back face of the semiconductor device 53B, like the semiconductor device 53A.

Back Face Structure of Semiconductor Device 53C as Shown in FIG. 3C

The semiconductor device 53C is substantially the same as the semiconductor elements 53A, 53B as shown in FIGS. 3A and 3B, except that the conductive path 51 exposed on the back face of the semiconductor device 53B is protruded from the insulating resin 50.

A feature of the invention resides in the protrusion of the conductive path 51. This protruding structure makes it possible to provide a desired interval between the conductive path 51 of the semiconductor device 53C and the conductive pattern 21 on the mounting board 10.

Accordingly, like the semiconductor devices 53A, 53B, the interconnect 21 can be extended under the semiconductor device 53C. Hence, by making use of the conductive path 51 and the fine metal wire 55A of the semiconductor device 53C, a multi-layer interconnect structure can be realized, with the simplified interconnect of the mounting board 10.

The insulating film RF may be applied on the back face of the semiconductor device 53C, like the semiconductor device 53A.

Referring to FIG. 19, the circuits employed in the hybrid integrated circuit device will be described below. Further, referring to FIGS. 10 to 18, the constituent parts of semiconductor device in the circuits will be described below.

FIG. 19 is an audio circuit, wherein an Audio Amp 1ch circuit portion, an Audio Amp 2ch circuit portion, and a switching power circuit portion are shown and enclosed by the bold dot-and-chain line.

In each of the circuit portions, a circuit enclosed by the solid line is formed as the semiconductor device. Firstly, the Audio Amp 1ch circuit portion is prepared with three semiconductor devices and two semiconductor devices integrated with the 2ch circuit portion.

Figure 10A:
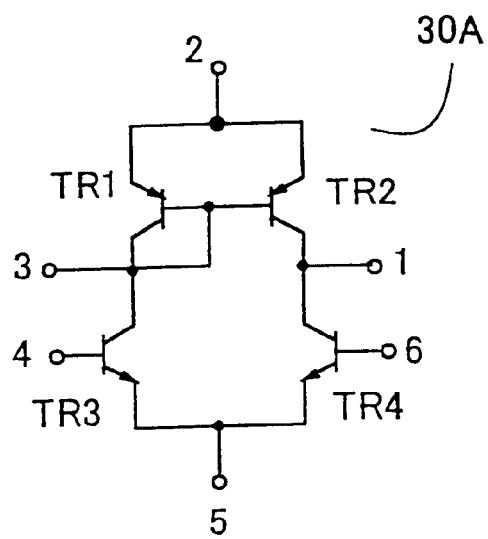
FIG. 10 is a view for explaining the semiconductor device of the invention.
Figure 10B:
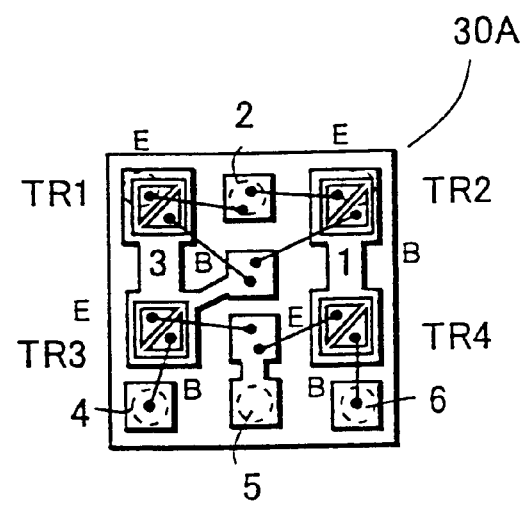

A first semiconductor device 30A has a current mirror circuit composed of TR1 and TR2 and a differential circuit composed of TR3 and TR4, which are integrally provided, as shown in FIG. 19. This semiconductor device 30A is shown in FIG. 10. Herein, four transistor chips as large as 0.55×0.55×0.24 mm are employed, and bonded by the Au fine wire. The size of the semiconductor device 30A is 2.9×2.9×0.5 mm.

The contact part indicated by the dotted line is 0.3 mmφ. In the figure, the number indicates a terminal number, and B, E denote the base and the emitter, respectively. These symbols are the same throughout FIGS. 10 to 18.

A second semiconductor device 31A constitutes a part of a predriver circuit with TR6 and D2 of FIG. 19. The predriver circuit is constituted of TR6, D2, R3, and R8 to drive TR9 and TR10 at the output stage. This semiconductor device 31A is shown in FIG. 11, and a diode D2 is a semiconductor chip having two TRs as one chip, making use of the PN junction between the base and the emitter. Herein, the diode D2 has a chip size of 0.75×0.75×0.145 mm, and TR6 has a chip size of 0.55×0.55×0.24 mm. The outer shape of the semiconductor device 31A is as large as 2.1×2.5×0.5 mm.

A third semiconductor device 32 constitutes a differential constant current circuit for passing a stable current through the differential circuit against the variations of the power voltage, and is made up of TR5, TR15, and D1 as shown in FIG. 19. D1 is a constant current bias diode for the differential circuit and the predriver circuit. This semiconductor device 32 is shown in FIG. 12, wherein TR5 and TR15 have a size of 0.55×0.55×0.24 mm, D1 has a size of 0.75×0.75×0.145 mm, and the outer dimension of the semiconductor device 32 is 2.1×3.9×0.5 mm.

A fourth semiconductor device 33A is a temperature compensating transistor TR8 as shown in FIG. 19, to compensate for an idling current against the temperature changes of the mounting board. TR8 is made up of one chip semiconductor element (0.75×0.75×0.145 mm) as shown in FIG. 13. If this is formed as the semiconductor device 33A, the outer shape is as large as 2.3×1.6×0.5 mm.

A fifth semiconductor device 34 has two chips of TR7 and TR17 as one package, TR7 for the predriver constant current circuit made up of TR7, R6 and R7 as shown in FIG. 19, and TR17 for the predriver constant current circuit in the Audio Amp 2ch circuit portion. This semiconductor device 34A consists of two single transistors (0.55×0.55×0.24 mm), the outer shape being 2.3×3.4×0.5 mm, as shown in FIG. 14.

Figure 15A:
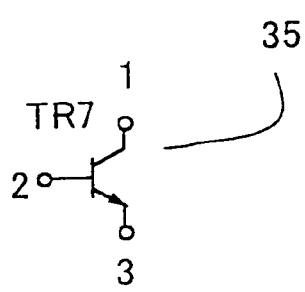
FIG. 15 is a view for explaining the semiconductor device of the invention.
Figure 15B:
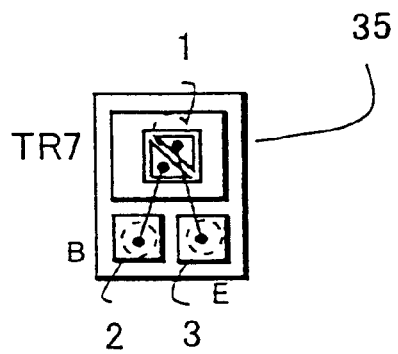

Two semiconductor devices 34A may be constituted separately. In this case, a semiconductor device 35 with one chip sealed as shown in FIG. 15 is employed. The outer shape of this semiconductor device 35 is as large as 2.3×1.6×0.5 mm.

The circuits 30B, 31B and 33B are the same as those 30A, 31A and 33A, as shown in FIG. 19, and explanation of them is omitted.

TR9 and TR10 are power transistors at the output stage, and R1, C1 and C2 are elements for preventing the abnormal oscillation.

On the other hand, a switching power circuit portion as shown to the right hand in FIG. 19 comprises a power voltage switching circuit made up of TR41, TR51, R41, R43, R51 and R53, a power voltage switching comparator made up of TR43, TR53, R40, R42, R50 and R52, a high frequency correcting circuit made up of diodes D45, D55, C43 and C53, and a rectifier diode made up of diodes D42, D43, D52 and D53.

Figure 16A:
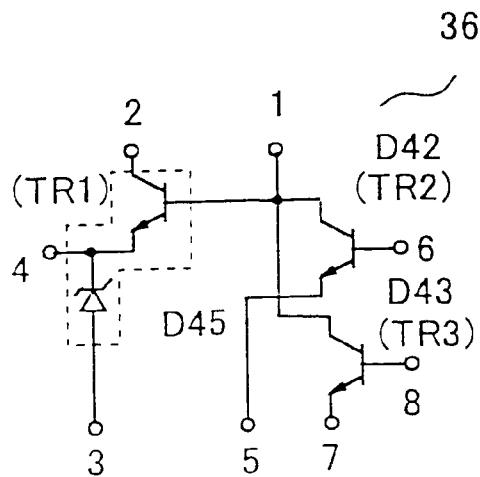
FIG. 16 is a view for explaining the semiconductor device of the invention.
Figure 16B:
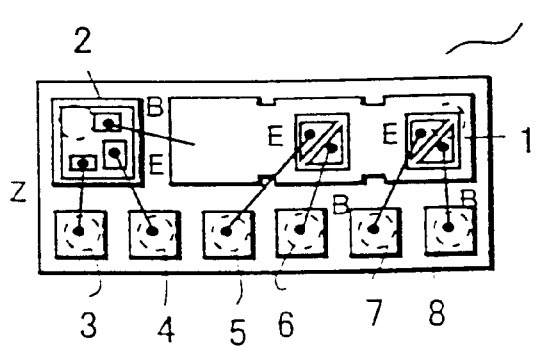

A sixth semiconductor device 36 has the diodes D42, D43 and a Zener diode D45 as one package in the power circuit of FIG. 19. A semiconductor chip mounted as the semiconductor device consists of a TR chip, and constitutes the diodes D42, D43 with a PN junction between base and collector. In FIG. 16, TR and the Zener diode enclosed by the dotted line is mounted as one chip, and D45 makes use of the Zener diode of this element. Also, to compensate for the voltage drop due to the temperature rise of the Zener diode, a base-emitter diode of the TR contained together is utilized.

The outer shape of TR with Zener is 0.6×0.6×0.24 mm, and the outer shape of other TRs is 0.35×0.35×0.24 mm. And the outer shape of the sealed package is 1.9×4.4×0.5 mm.

A seventh semiconductor device 37 has the diodes D52, D53 and a Zener diode D55 as one package in the power circuit of FIG. 19. A semiconductor chip mounted as the semiconductor device has substantially the same structure as that of FIG. 16, except that the transistor corresponding to D53 and D52 is the PNP type.

Figure 17A:
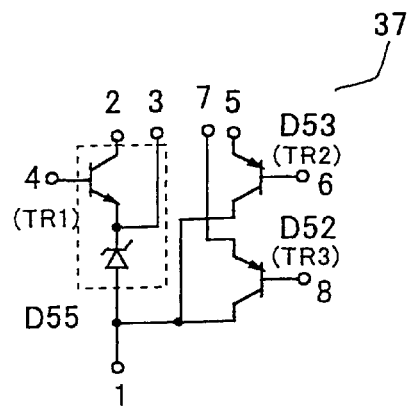
FIG. 17 is a view for explaining the semiconductor device of the invention.
Figure 17B:
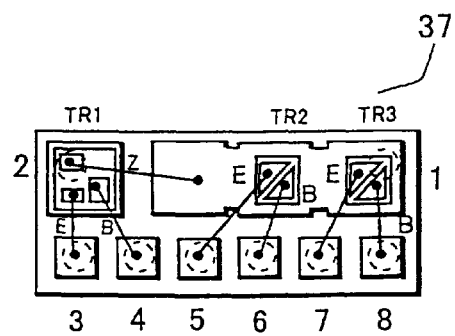
Figure 18A:
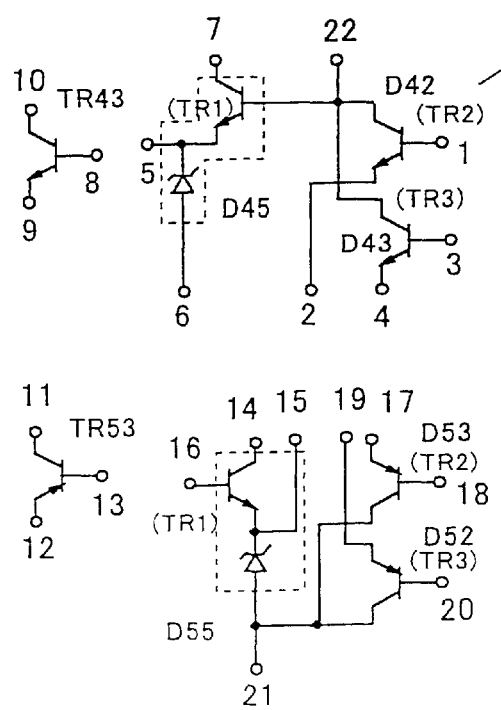
FIG. 18 is a view for explaining the semiconductor device of the invention.
Figure 18B:
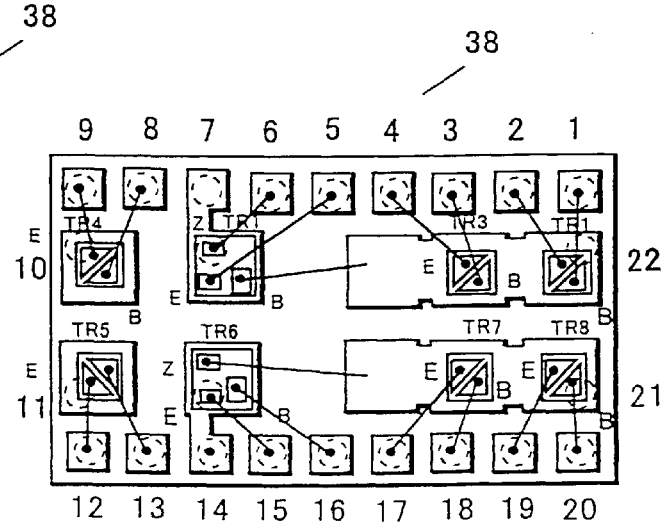

An eighth semiconductor device 38 of FIG. 18 has the circuits of FIGS. 16 and 17 and the TR43, TR53 as one package. The outer shape of the sealed package is 4×5.7×0.5 mm. And this semiconductor device 38 is mounted as the semiconductor device 53 of FIGS. 1 and 2.

As described above, the semiconductor device is a discrete type with one TR mounted, or a hybrid IC type for constituting a desired circuit with a plurality of TRs mounted. Herein, the TR is only employed, but a plurality of elements including IC, LSI, system LSI, and a passive element may be mounted. In the experiments, the maximum size was 5×5.7×0.5 mm. However, the circuit elements to be mounted may be increased to make the size larger.

These semiconductor devices mounted on the mounting board 10 are shown in FIG. 1. As will be understood from the comparison with the conventional type mounting board as shown in FIG. 20, the interconnect pattern is simplified.

FIG. 21 shows how the circuit size is reduced by adopting the semiconductor device of the invention. In the figure, the photographs are at equal magnification, wherein a single SMD employing the lead frame, a composite SMD employing the lead frame, and the semiconductor device of the invention are shown from the left side. The single SMD has one TR molded, and the composite TR has two TRs molded. The semiconductor device of the invention constitutes a circuit as shown in FIG. 10, with four TRs sealed. As will be apparent from the figure, the size of this semiconductor device is slightly larger than the composite SMD including the lead frame, though double as many elements of the composite SMD are sealed. The semiconductor device 35 of FIG. 15 with one TR sealed is shown on the rightmost side. As can be seen from the figure, the small and thin semiconductor device can be realized with this invention, and is optimal for the portable electronic equipment.

As will be apparent from the above description, in a hybrid integrated circuit device of the present invention, among a plurality of sorts of fine metal wires employed, a semiconductor device having at least one sort of fine metal wire and a semiconductor element connected thereto sealed integrally is prepared, whereby the number of assembling steps for the mounting board can be significantly reduced.

For example, in the hybrid integrated circuit device using the Au wire of 40 $\mu$m, the Al wire of 150 $\mu$m and the Al wire of 300 $\mu$m, because the Au wire and the semiconductor element connected by the Au wire are formed as one package, which is fixed on a mounting board, the connection of the fine metal wire on the mounting board may be effected by wire bonding the Al wire alone. Accordingly, a wire bonding apparatus for the Au wire can be omitted from this assembling process, and this bonding of the Au wire can be also omitted. Also, if a semiconductor device having a plurality of semiconductor elements, or a plurality of semiconductor elements and a plurality of passive elements is fabricated as one package, the bonding of the semiconductor elements and the passive elements can be dispensed with.

Hence, the assembling process and the steps are shortened, the delivery to the user is expedited, and the manufacturing costs are less expensive.

An insulating resin is applied on the back face of the semiconductor device, and the conductive path of the back face is recessed, or protruded, so that the interconnect on the mounting board can be extended to the back side of the semiconductor device. Hence, a multi-layer structure can be realized using the conductive path of the semiconductor device, the fine metal wire, and the interconnect on the mounting board. Hence, an electronic circuit can be constituted without adopting any expensive multi-layer substrate. Though conventionally a multi-layer substrate of two, three or four layers was often used, a mounting board with the less number of layers can be adopted by employing this semiconductor device.

Since a thin and light circuit device that is constituted of a minimum of the semiconductor elements, the conductive paths and the insulating resin is employed, with the conductive path on the back face of semiconductor element exposed from the insulating resin, a hybrid integrated circuit device capable of connecting it with the conductive path on the mounting board can be provided.

The heat of the circuit elements contained inside can be radiated to the mounting board, and it is possible to provide a thin and light hybrid integrated circuit device.

Since the side face of the conductive path has a curved structure, it is possible to prevent slippage or warp of the conductive paths against heating of the whole circuit device. And because of the excellent heat radiating structure as the hybrid integrated circuit device, it is possible to suppress the temperature rise of the circuit device itself, and prevent the slippage or warp of the conductive paths. Accordingly, the reliability of the overall hybrid integrated circuit device with the thin and light circuit device mounted can be improved.

Further, if a metallic substrate is used as the mounting board, the heat generation of the circuit device to be mounted can be suppressed, whereby a hybrid integrated circuit device capable of passing a greater drive current can be provided.

The present invention is not limited to the specific above-described embodiments. It is contemplated that numerous modifications may be made to the vehicular headlamp of the present invention without departing from the spirit and scope of the invention as defined in the following claims.

What is claimed is:

1. A hybrid integrated circuit device comprising:
    a mounting board having at least an insulated surface with a plurality of conductive patterns formed thereon;
    semiconductor elements electrically connected to said conductive patterns; and
    fine metal wires directly coupling said semiconductor elements to said conductive patterns, at least a group of said fine metal wires having a diameter different from another group of said fine metal wires,
    wherein at least one of said semiconductor elements is coupled to conductive paths by some of the fine metal wires; said at least one of the semiconductor elements, said fine metal wires coupled thereto and said conductive paths are integrally molded as a single package and mounted on said mounting board to couple the conductive path to at least one of the conductive patterns.

2. The hybrid integrated circuit device according to claim 1, wherein at least a group of said fine metal wires is made of a material different from another group of said fine metal wires.

3. A semiconductor device comprising:
    semiconductor elements;
    conductive paths which are spatially discrete;
    fine metal wires directly coupling at least one of said semiconductor elements to the conductive paths, and at least a group of said fine metal wires being made of a material different from another group of said fine metal wires, a part of said fine metal wires having a diameter different from another part of said fine metal wires,
    wherein said at least one of the semiconductor elements, said group of the fine metal wires and said spatially discrete conductive paths are integrally molded as a single package.

4. A hybrid integrated circuit device comprising:
    a mounting board having at least an insulated surface with a plurality of conductive patterns;
    a small signal type semiconductor element electrically connected to a set of said conductive patterns;
    a large signal type semiconductor element electrically connected to at least one of said conductive patterns;
    fine metal wires, at least a group of said fine metal wires having a smaller diameter than another group of said fine metal wires, wherein
    said smaller diameter fine metal wires are used to couple directly bonding electrodes of said small signal type semiconductor element to conductive paths,
    wherein said small signal type semiconductor element, said fine metal wires and said conductive paths are integrated as a package and mounted on said mounting board to electrically couple the conductive paths to said set of conductive patterns.

5. A hybrid integrated circuit device comprising:
a mounting board having at least an insulated surface with a plurality of conductive patterns;
a small signal type semiconductor element electrically connected to at least one of said conductive patterns;
a large signal type semiconductor element electrically connected to a set of said conductive patterns;
fine metal wires, at least a group of said fine metal wires having a larger diameter than another group of said fine metal wires, wherein
said larger diameter fine metal wires are used to couple directly bonding electrodes of said large signal type semiconductor element to conductive paths,
wherein said large signal type semiconductor element, said fine metal wires and said conductive paths are integrated as a package and mounted on said mounting board to electrically couple the conductive paths to said set of conductive patterns.

6. The hybrid integrated circuit device according to claim 4 or 5, wherein the fine metal wires are Au wires.

7. The hybrid integrated circuit device according to claim 4 or 5, wherein the fine metal wires are Al wires.

8. A hybrid integrated circuit device comprising:
a mounting board having at least an insulated surface and with a plurality of conductive patterns,
a small signal type semiconductor element electrically connected to a set of said conductive patterns,
a large signal type semiconductor element electrically connected to at least one of said conductive patterns,
small diameter fine metal wires to couple directly bonding electrodes of said small signal type semiconductor element to conductive paths, and
large diameter fine metal wires to couple directly bonding electrodes of said large signal type semiconductor element to at least one of said conductive patterns wherein said small signal type semiconductor element, said small diameter fine metal wires and said conductive paths are integrated as a package and mounted on said mounting board to electrically couple the conductive paths to said set of the conductive patterns.

9. A hybrid integrated circuit device comprising:
a mounting board having at least a surface insulated and with a plurality of conductive patterns,
a small signal type semiconductor element electrically connected to said conductive patterns,
a large signal type semiconductor element electrically connected to a set of said conductive patterns,
large diameter fine metal wires to couple directly bonding electrodes of said large signal type semiconductor element to conductive paths; and
small diameter fine metal wires to couple directly bonding electrodes of said small signal type semiconductor element to at least one of said conductive patterns, wherein
said large signal type semiconductor element, said large diameter fine metal wires and said conductive paths are integrated as a package and mounted on the mounting board to electrically couple the conductive paths to said set of the conductive patterns.

10. A hybrid integrated circuit device comprising:
a mounting board having at least a surface insulated and with a plurality of conductive patterns;
a small signal type semiconductor element electrically connected to said conductive pattern;
a large signal type semiconductor element electrically connected to said conductive pattern;
Au-metal wires to couple directly electrodes of said small signal type semiconductor element to said conductive patterns, and
Al-metal wires to couple directly electrodes of said large signal type semiconductor element to at least one of said conductive patterns, at least a part of said Au wires having a diameter different form at least a part of said Al wires;
a semiconductor device having a plurality of conductive paths electrically separated by wenches, a small signal type semiconductor element fixed on said conductive path, and an Au wire coupling said small signal type semiconductor element to said conductive path; and
an insulating resin coating said semiconductor element and the Au-metal wire coupled thereto and filling in said trenches between said conductive patterns to integrally support the semiconductor device, with a back face of said conductive paths exposed, wherein
said semiconductor device is mounted on the mounting board to couple the exposed conductive paths to the conductive patterns.

11. A hybrid integrated circuit device comprising:
a mounting board having at least an insulated surface and with a plurality of conductive patterns;
a small signal type semiconductor element electrically connected to said conductive pattern;
a large signal type semiconductor element electrically connected to said conductive pattern;
Au-metal wires to couple directly electrodes of said small signal type semiconductor hat element to at least one of the conductive patterns, and
Al-metal wires to couple directly electrodes of said large signal type semiconductor element to at least one of the conductive patterns, at least a part of said Au wires having a diameter different form at least a part of said Al wires;
a semiconductor device having a plurality of conductive paths electrically separated by trenches, a large signal type semiconductor element fixed on said conductive path, an Al wire coupling said large signal type semiconductor element to said conductive pat; and
an insulating resin coating said large signal type semiconductor element and the Al wire coupled thereto and filling in said trenches between said conductive paths to integrally support the semiconductor device, with a back face of said conductive parts exposed, wherein
said semiconductor device is mounted on the mounting board to couple the exposed conductive pats to the conductive patterns.

12. A hybrid integrated circuit device comprising:
a mounting board having at least an insulated surface and with a plurality of conductive patterns;
a small signal type semiconductor element electrically connected to said conductive pattern;
a large signal type semiconductor element electrically connected to said conductive pattern;
a small diameter fine metal wire to couple directly at least a bonding electrode of said small signal type semiconductor element to said conductive pattern;
a large diameter fine metal wire to couple directly said conductive patterns to said conducting pattern;
a semiconductor device having a plurality of conductive paths electrically separated by trenches, a small signal type semiconductor element fixed on said conductive path, a small diameter fine metal wire coupling said small signal type semiconductor clement to said conductive path; and an insulating resin coating said semiconductor element and the small diameter fine wire and filling in said trenches between said conductive paths to integrally support the semiconductor device, with a back face of said conductive paths exposed, wherein said semiconductor device is mounted on the mounting board to couple the exposed conductive paths to the conductive patterns, and connecting means other than said small diameter fine metal wire is used in an area except where said semiconductor device is mounted.

13. A hybrid integrated circuit device comprising;

a mounting board having at least an insulated surface and with a plurality of conductive patterns;

a small signal type semiconductor element electrically connected to said conductive patterns;

a large signal type semiconductor element electrically connected to said conductive patterns, a small diameter fine metal wire to couple directly said small signal type semiconductor element to said conductive patterns;

a large diameter fine metal wire to couple directly said large signal type semiconductor element to said conductive patterns;

a semiconductor device having a plurality of conductive paths electrically separated by trenches, a large signal type semiconductor element fixed on said conductive path, a large diameter fine metal wire coupling said large signal type semiconductor element to said conductive path;

an insulating resin coating said large signal type semiconductor element and the large diameter fine metal wire and filling in said trenches between said conductive paths to integrally support the semiconductor device, with a back face of said conductive paths exposed, wherein said semiconductor device is mounted on the mounting board to couple the exposed conductive paths to the conductive patterns, and connecting means other than said large diameter fine metal wire is used in an area except where said large signal type semiconductor device is mounted.

14. A hybrid integrated circuit device comprising:

a mounting board having at least an insulated surface and with a plurality of conductive patterns;

a small signal type semiconductor element electrically connected to said conductive patterns;

a large signal type semiconductor element electrically connected to said conductive patterns;

a small diameter fine metal wire to couple directly said small signal type semiconductor element to said conductive patterns;

a large diameter fine metal wire to couple directly said large signal type semiconductor element to said conductive patterns;

a semiconductor device having a plurality of conductive paths electrically separated by trenches, a small signal type semiconductor element fixed on said conductive path, a small diameter fine metal wire coupling said small signal type semiconductor element to said conductive path; and an insulating resin coating said small signal type semiconductor element and the fine metal wire and filling in said trenches between said conductive paths to integrally support the semiconductor device, with a back race of said conductive paths exposed, wherein said semiconductor device is mounted on the mounting board to couple the exposed conductive paths to the conductive patterns, and said small diameter fine metal wire and said large diameter fine metal wire are used within said semiconductor device, and said fine metal wire is not used in an area except where said semiconductor device is mounted.

15. The hybrid integrated circuit device according to any one of claims 10 to 14, wherein a side face of said conductive paths has a curved structure.

16. The hybrid integrated circuit device according to any one of claims 10 to 14, wherein a conductive film is provided on said conductive paths.

17. The hybrid integrated circuit device according to any one of claims 1, 2, 4, 5, or 8 to 14, wherein an active element and/or a passive element, besides said semiconductor element, are contained and electrically connected to said conductive path, and a circuit is formed including said active element and/or said passive element.

18. The hybrid integrated circuit device according to any one of claims 10 to, 14, wherein said conductive paths comprise Cu, Al, Fe—Ni alloy, Cu—Al laminate, Al—Cu—Al laminate, or Cu—Al—Cu laminate.

19. The hybrid integrated circuit device according to claim 16, wherein said conductive film comprises Ni, Au, Ag or Pd.

* * * * *